United States Patent [19]

Matsumoto et al.

[11] Patent Number: 5,696,511
[45] Date of Patent: Dec. 9, 1997

[54] VOLTAGE COMPARATOR AND PIPELINE TYPE A/D CONVERTER

[75] Inventors: Osamu Matsumoto; Toshio Kumamoto, both of Hyogo, Japan

[73] Assignee: Mitsubishi Denki Kabushiki Kaisha, Tokyo, Japan

[21] Appl. No.: 738,585

[22] Filed: Oct. 29, 1996

[30] Foreign Application Priority Data

Apr. 5, 1996 [JP] Japan .................. 8-084012(P)

[51] Int. Cl.⁶ ........................................ H03M 1/42
[52] U.S. Cl. .............................. 341/161; 341/155
[58] Field of Search .......................... 341/161, 162, 341/141, 155, 156, 172

[56] References Cited

U.S. PATENT DOCUMENTS 5,572,212  11/1996  Levinson et al. ................ 341/162
5,594,445  1/1997  Ginetti ............................ 341/162

OTHER PUBLICATIONS

"A10-b 20-Msample/s Analog-to-Digital Converter", Lewis et al., IEEE Journal of solid-state Circuits, vol. 27, No. 3 Mar. 1992, pp. 351-358.

"A13-b 2.5MHz Self-Calibrated Pipeline A/D Converter in 3-um CMOS", Lin et al., IEEE Journal of Solid-State Circuits, vol. 26, No. 4 Apr. 1991, pp. 628-636.

Primary Examiner—Brian K. Young
Attorney, Agent, or Firm—Lowe, Price, Leblanc & Becker

[57] ABSTRACT

In a pipeline type A/D converter, a sample/hold·subtracter circuit of an A/D converter block of a first stage samples an analog voltage and outputs an offset voltage at a first phase, and subtracts an output voltage of an A/D converter from the sampled analog voltage in a second phase. An A/D converter of an A/D converter block of a succeeding stage subtracts the output voltage of the sample/hold·subtracter circuit of the first phase from the output voltage of the sample hold·subtracter circuit of the second phase, and converts the subtracted result into a digital code. The influence of an offset of a differential amplifier included in the sample/hold·subtracter circuit is removed so that A/D conversion of high accuracy is allowed.

10 Claims, 15 Drawing Sheets

VOLTAGE COMPARATOR AND PIPELINE TYPE A/D CONVERTER

BACKGROUND OF THE INVENTION

1. Field of the Invention

The present invention relates to a voltage comparator and a pipeline type A/D converter using such a voltage comparator. Particularly, the present invention relates to a voltage comparator that samples an external voltage during a sampling period for comparing the sampled external voltage with a predetermined reference voltage during a comparison period to provide a comparison result, and a pipeline type A/D converter operating in synchronization with a clock signal for converting an externally applied analog voltage into a digital code of a predetermined number of bits.

2. Description of the Background Art

FIG. 21 is a block diagram showing a structure of a conventional pipeline type A/D converter. Referring to FIG. 21, this pipeline type A/D converter includes a sample/hold circuit 80, n stages of A/D converter blocks 81.1~81.n, and a logic circuit 85. Each of A/D converter blocks 81.1~81.n−1 includes A/D converters 82.1~82.n−1, D/A converters 83.1~83.n−1, and subtracter circuits 84.1~84.n−1. A/D converter block 81.n includes A/D converter 82.n.

Sample/hold circuit 80 samples an input analog potential signal VS1 for every constant period to hold the sampled signal for a predetermined time. The held analog potential VS1 is applied to A/D converter block 81.1 to be sampled by subtracter circuit 84.1 in block 81.1. The same analog potential VS1 is applied to A/D converter 82.1 of block 81.1 to be converted into a digital code. This digital code is converted into an analog potential by a D/A converter 83.1. Subtracter circuit 84.1 subtracts that analog potential from a presampled analog potential. Assuming that the resolution of A/D converter 82.1 is m1 bits, the subtracted result is multiplied $2^{m1}$ times, and applied to the next stage A/D converter block 81.2.

Similar to A/D converter block 81.1, an analog potential is sampled by subtraction circuit 84.2 in A/D converter block 81.2. The sampled analog potential is A/D converted by A/D converter 82.1 and then D/A converted by D/A converter 83.2. Subtracter circuit 84.2 subtracts the output potential of D/A converter 82.2 from the sampled analog potential. Assuming that the resolution of A/D converter 82.2 is m2, the subtracted result is multiplied $2^{m2}$ times and applied to the succeeding stage of A/D converter block 81.3.

The above-described operation is repeated up to A/D converter block 81.n−1 which is at the (n−1)th stage. At A/D converter block 81.n which is the last stage, the output potential of A/D converter block 81.n−1 of the preceding stage is converted into a digital code by A/D converter 82.n.

The digital code generated at each of blocks 81.1~81.n is applied to logic circuit 85. Logic circuit 85 carries out appropriate processes such as digital addition and correction on the digital code to generate and output one digital code D0.

FIG. 22 is a circuit diagram showing a structure of a potential comparator included in A/D converter 82.1 shown in FIG. 21. Referring to FIG. 22, the potential comparator includes P channel MOS transistors 92~95, and N channel MOS transistors 96~101. MOS transistors 92, 93, 97 and MOS transistors 94, 95, 98 are connected in series between a power supply potential Vcc line (referred to as "potential line " hereinafter) 90 and a ground potential GND line (referred to as "ground line" hereinafter). MOS transistor 97 has its gate connected to the drain (output node N95) of MOS transistor 95. MOS transistor 98 has its gate connected to the drain (output node N93) of MOS transistor 93.

N channel MOS transistor 96 is connected between nodes N93 and N95, and receives a signal /L at its gate. N channel MOS transistors 99 and 101 are connected in series between the drain of P channel MOS transistor 92 (node N92) and ground line 91. N channel MOS transistor 100 is connected between node N94 and the source of MOS transistor 99 (node N99). MOS transistors 99 and 100 receive input potential VS1 and reference potential Vr, respectively, at their gates. The gates of MOS transistors 92 and 94, the gates of MOS transistors 93 and 95, and the gate of MOS transistor 101 receive constant potentials Vg2, Vg3, and Vg4, respectively. MOS transistors 92 and 94 operate as constant current sources. MOS transistors 93, 95 and 101 operate at a saturated state.

The potential comparator compares the held analog potential VS1 and reference potential Vr to provide output potentials VO1 and VO2 to output nodes N93 and N95, respectively, according to the comparison result. The difference between VS1 and Vr is converted into the difference of the drain currents between MOS transistors 99 and 100. By using P channel MOS transistors 93 and 95, the amplitude of the potentials of nodes N92 and N94 becomes smaller to allow an operation at a higher rate. The drain current of P channel MOS transistors 93 and 95 is the drain current of P channel MOS transistors 92 and 95 minus the drain current of N channel MOS transistors 99 and 100.

N channel MOS transistors 97 and 98 function as loads to determine output potentials VO1 and VO2. It is to be noted that the two output potentials VO1 and VO2 equal each other since output nodes N93 and N95 are short-circuited when signal /L attains an H level (logical high). When signal /L attains an L level (logical low), output nodes N93 and N95 are disconnected, whereby one of output voltages VO1 and VO2 becomes higher than the other according to the potential difference between VS1 and Vr. Here, output potential VO2 is applied to the gate of N channel MOS transistor 97, and output potential VO1 is applied to the gate of N channel MOS transistor 98. As a result, the higher one of potentials VO1 and VO2 is further increased, and the lower one of VO1 and VO2 is further reduced.

In A/D converter 82.1, a plurality of potential comparators each receiving a different reference potential Vr are provided. A/D converter 82.1 generates a digital code according to output potentials VO1 and VO2 of the potential comparators. The same applies for the other A/D converters 82.2~82.n.

FIG. 23 is a circuit block diagram showing a structure of subtracter circuit 84.1 shown in FIG. 21. Referring to FIG. 23, subtracter circuit 84.1 includes switches S91.1, S92.1, S93.1; ...., S91N, S92N, S93N, capacitors 102.1~102.N, a switch S94, and an amplifier 103. The held analog potential VS1 is applied to one electrode of capacitors 102.1~102N via switches S93.1~93N, respectively. Predetermined potentials VDA and VDAB are applied to one electrode of capacitors 102.1~102.N via switches S92.1~S92.N, S91.1~S91.N, respectively. The other electrodes of capacitors 102.1~102.N are connected to input node 103a of amplifier 103. A bias potential Vb is applied via a switch S94 to input node 103a of amplifier 103. Output VS2 of amplifier 103 is applied to the succeeding stage of A/D converter block 81.2.

The operation of subtracter circuit 84.1 will be described hereinafter. Subtracter circuit 84.1 carries out subtraction at the two periods, i.e., a sample period and a subtraction period. During a sample period, switches S93.1~S93.N, and S94 are rendered conductive, and switches S91.1~S91.N, S92.1~S92.N are rendered non-conductive. Capacitors 102.1~102.N are charged by bias potential Vb and analog potential VS1. Here, the charge of Q=N×C×(Vb−VS1) is stored at input node 103a of amplifier 103.

At the next subtraction period, switches S93.1~S93.N, and S94 are rendered non-conductive, and one of the respective pairs of switches S91.1, S92.1; . . . ; S91.N, S92.N is rendered conductive. Assuming that m switches S92 are rendered conductive and N−m switches S91 are rendered non-conductive, the charge stored in capacitors 102.1~102.N becomes:

$$Q=m\times C\times(VX-VDA)+(N-m)\times C\times(VX-VDAB)$$

where VX is the potential of input node 103a of amplifier 103. Since there is no change in the amount of charge during these two periods, the equation of:

$$N\times C\times(Vb-VS1)=m\times C\times(VX-VDA)+(N-m)\times C\times(VX\times VDAB)$$

is established. As a result:

$$VX=Vb-(VS1-(m\times VDA+(N-m)\times VDAB)/N)$$

Accordingly, subtraction where the subtraction potential is (m×VDA+(N−m)×VDAB)/N is executed. The subtraction potential is determined depending upon the ratio of conducting switches S91 to S92 (m/(N−m)) and the predetermined voltages of VDA and VDAB. Potential VX is amplified by amplifier 103 to be provided to A/D converter block 81.2 which is the succeeding stage. The other subtracter circuits 84.2~84.n−1 have the same structure.

It was impossible in a conventional pipeline type A/D converter to prevent generation of an error caused by offset of amplifiers in particularly subtracter circuits 84.1~84.n−1 because a voltage of a certain moment was taken.

Since a conventional voltage comparator amplifies an input signal and a reference voltage for comparison, the amplification operation was time consuming to result in delay of determination.

SUMMARY OF THE INVENTION

In view of the foregoing, an object of the present invention is to provide a pipeline type A/D converter of high accuracy.

Another object of the present invention is to provide a voltage comparator that has a short determination time.

In a first pipeline type A/D converter of the present invention, a first sample/hold circuit samples an analog voltage at a time period when a clock signal attains a first potential to provide an offset voltage, and subtracts an output voltage of a D/A converter from the sampled analog voltage at a period when the clock signal attains a second potential. A subtracter circuit subtracts an output voltage of the first sample/hold circuit of a period when the clock signal attains the first potential from the output voltage of the first sample/hold circuit of a period when the clock signal attains the second potential for providing the subtracted value to a second A/D converter. Therefore, the influence of the offset of the first sample/hold circuit can be removed to carry out A/D conversion at high accuracy.

Preferably, the first A/D converter includes a first voltage generation circuit, a plurality of first voltage comparator circuits, and a first encoder. The D/A converter includes a first switch. The second A/D converter includes a second voltage generation circuit, a plurality of second voltage comparator circuits, and a second encoder. Accordingly, the first A/D converter, the D/A converter, and the second A/D converter can be readily implemented.

Preferably, each first voltage comparator circuit includes first and second output nodes, first and second constant current sources, first to fourth transistors, and a switch circuit. Accordingly, A/D conversion can be carried out more speedily.

More preferably, there are provided a second sample/hold circuit for sampling a second reference voltage corresponding to 1 LSB of the first A/D converter at a period when the clock signal attains a second potential to provide an offset voltage, and for providing the sampled second reference voltage at a period when the clock signal attains the first potential, and a second subtracter circuit for subtracting a value of a second reference voltage for comparison generated by dividing an output voltage of the second sample/hold circuit of a period when the clock signal attains the second potential level from a value of a second reference voltage for comparison of a period when the clock signal attains the first potential level. According to the above-described structure, the influence of offset of the second sample/hold circuit can be removed to allow A/D conversion of a further higher accuracy.

A second pipeline type A/D converter of the present invention is a differential structure version of the first pipeline type A/D converter. Noise can be removed to allow an A/D conversion at a higher accuracy.

Preferably, the first A/D converter includes a reference potential generation circuit, a plurality of potential comparator circuits, and a first encoder. The D/A converter includes fourth and fifth switches. The second A/D converter includes a reference voltage generation circuit, a plurality of voltage comparator circuits, and a second encoder. Accordingly, the first A/D converter, the D/A converter, and the second A/D converter can readily be implemented.

Preferably, each potential comparator circuit includes first and second output nodes, first and second constant current sources, first to fourth transistors, and a switching circuit. Accordingly, A/D conversion can be carried out more speedily.

Preferably, there are further provided a sample/hold circuit for sampling a voltage corresponding to 1 LSB of the first A/D converter at a period when the clock signal attains a second potential level to provide an offset voltage, and for providing a second reference voltage that is sampled at a period when the clock signal attains the first potential, and a second subtracter circuit for subtracting a value of a reference voltage for comparison generated by dividing an output voltage of the sample/hold circuit of a time period when the clock signal attains the second potential from a value of a reference voltage for comparison of a period when the clock signal attains the first potential. Accordingly, the influence of offset of the sample/hold circuit can be removed to allow A/D conversion of a further higher accuracy.

Preferably, the first subtracter circuit includes a fifth capacitor, a sixth capacitor, and a tenth switch. The second subtracter circuit includes seventh and eighth capacitors. Accordingly, the first and second subtracter circuits can be implemented readily.

The voltage comparator of the present invention includes first and second output terminals, first and second constant current sources, first to fourth transistors, and a comparator circuit, and does not carry out amplification. Therefore, the time required for determination is shorter than the conventional case.

DESCRIPTION OF THE PREFERRED EMBODIMENTS

Figure 1:
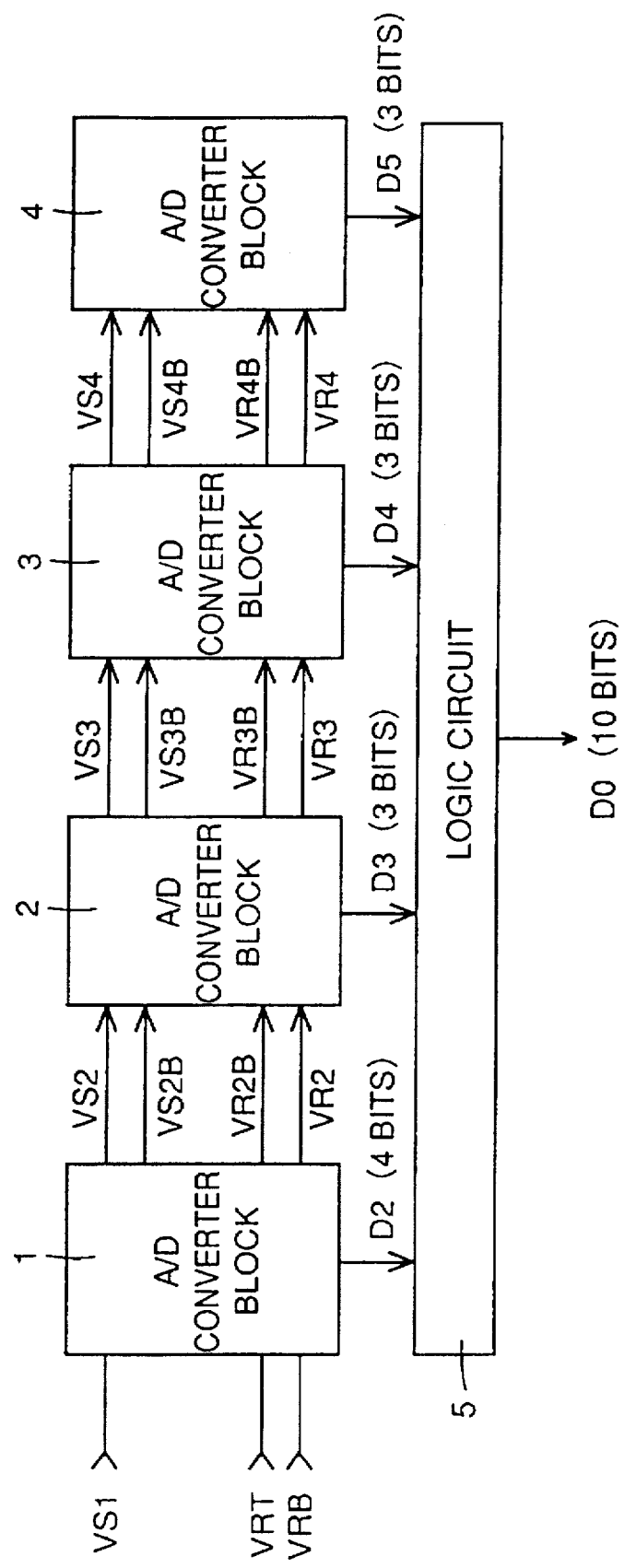
FIG. 1 is a block diagram showing a structure of a pipeline type A/D converter according to an embodiment of the present invention.

Referring to FIG. 1, a pipeline type A/D converter of a first embodiment of the present invention includes four stages of A/D converter blocks 1–4, and a logic circuit 5.

A/D converter block 1 of the first stage receives an analog potential signal VS1, a maximum value VRT and a minimum value VRB of a reference potential to convert a sample value of analog potential signal VS1 into a digital code D2 of four bits, which is provided to logic circuit 5. A/D converter block 1 provides signals VS2, VS2B and signals VR2, VR2B for generating a reference voltage to A/D converter block 2 of the next stage.

A/D converter block 2 of the second stage converts signals VS2 and VS2B applied from the preceding block 1 into a digital code D3 of 3 bits, which is provided to logic circuit 5, and provides signals VS3 and VS3B, and signals VR3 and VR3B for generating a reference voltage to A/D converter block 3 of the succeeding stage.

A/D converter block 3 of the third stage converts signals VS3 and VS3B applied from block 2 of the prior stage into a digital code D4 of 3 bits, which is provided to logic circuit 5, and also provides signals VS4 and VS4B, and signals VR4 and VR4B for reference voltage generation to the succeeding A/D converter block 4.

A/D converter block 4 of the last stage converts signals VS4 and VS4B applied from preceding block 3 into a digital code D5 of 3 bits, which is provided to logic circuit 5.

Logic circuit 5 generates and provides a digital code D0 of 10 bits according to the input digital codes D2–D5.

Figure 2:
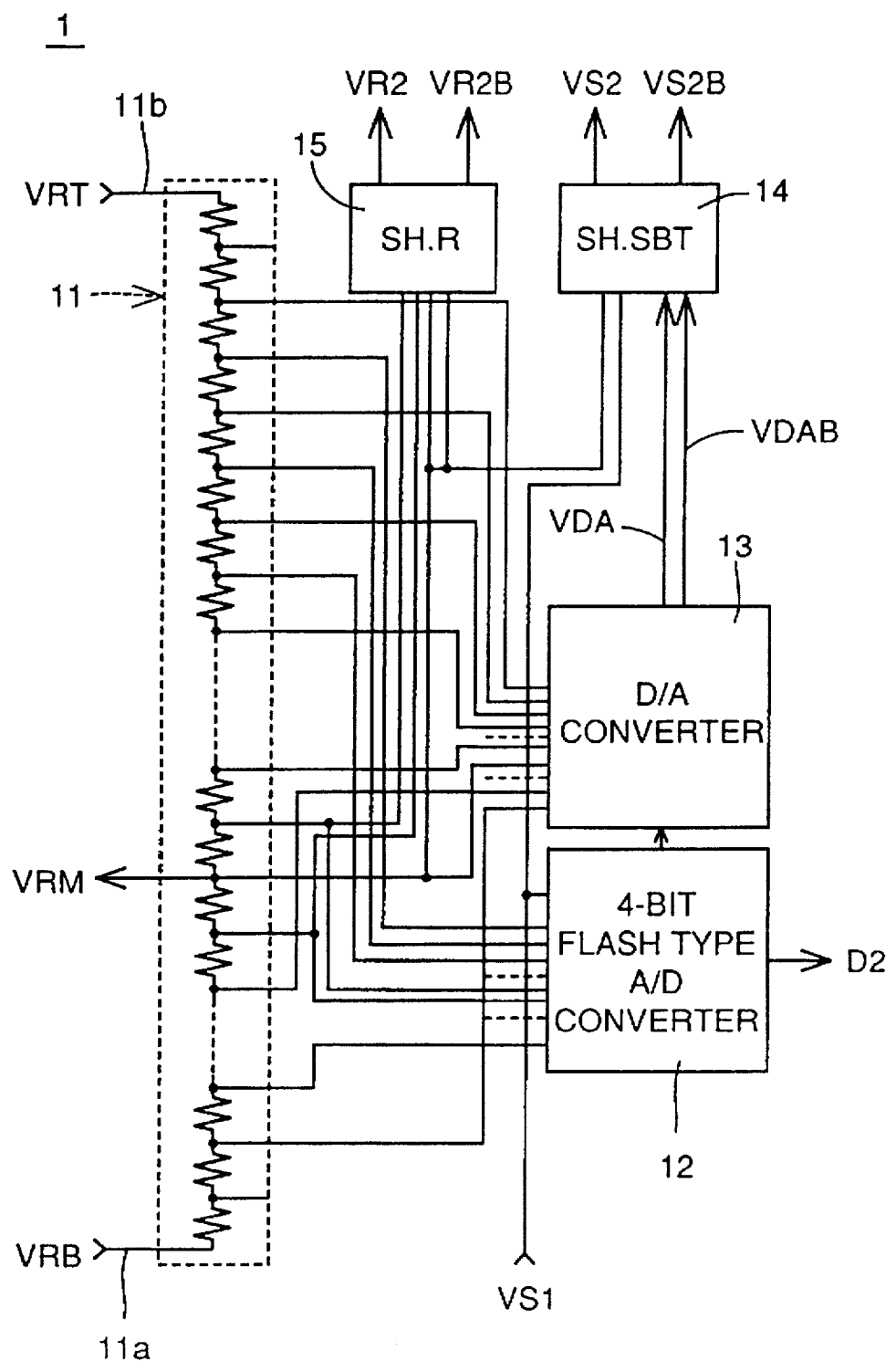
FIG. 2 is a block diagram of a first-stage A/D converter block 1 shown in FIG. 1 with a portion thereof omitted.

FIG. 2 is a circuit block diagram showing a structure of A/D converter 1 of the first stage. Referring to FIG. 2, A/D converter 1 includes a reference potential generation circuit 11, a 4-bit flash type A/D converter 12, a D/A converter 13, a sample hold•subtracter circuit (referred to as SH.SBT hereinafter) 14, and a sample/hold circuit (referred to as SH.R hereinafter) 15 for generating a reference voltage of A/D converter block 2 of the next stage.

Figure 3:
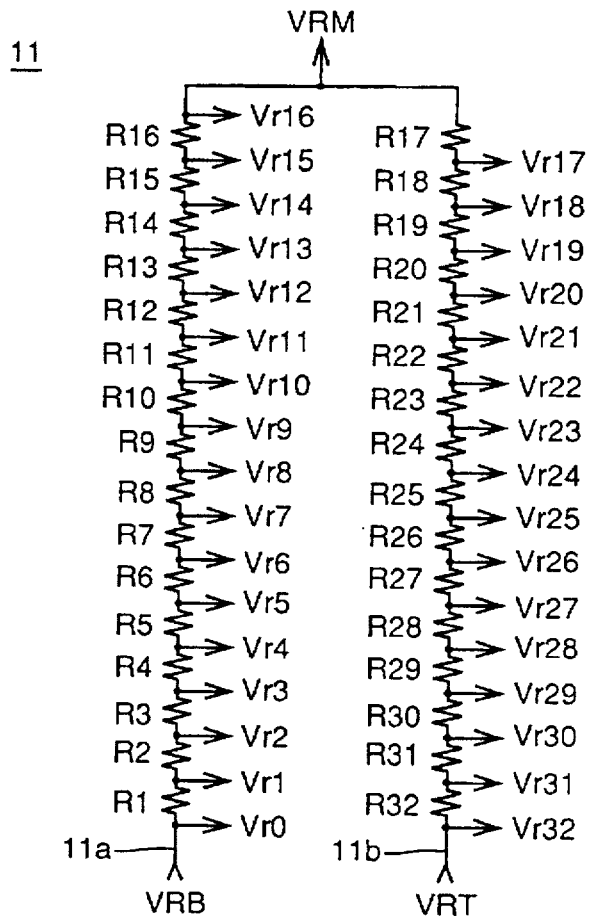
FIG. 3 is a circuit diagram showing a structure of a reference potential generation circuit 11 of FIG. 2.

As shown in FIG. 3, reference potential generation circuit 11 includes 32 resistor elements R1~R32 connected in series between a low potential end terminal 11a and a high potential end terminal 11b. The 32 resistor elements R1~R32 have the same resistance value. A minimum value VRB (Vr0) of a reference potential is applied to low potential end terminal 11a. A maximum value VRT (Vr32) of a reference potential is applied to high potential end terminal 11b. Reference potentials Vr1~Vr31 are output from the node of each high potential end of resistor elements R1~R31, respectively. Reference potential Vr16 is an intermediate potential VRM between reference potentials Vr32 and Vr0.

Reference potentials Vr3, Vr5, Vr7, . . . , Vr27, Vr29 are applied to A/D converter 12 to be output as reference potentials used for comparison corresponding to 1.5, 2.5, 3.5, . . . , 13.5, 14.5 LSB. Reference potentials Vr2, Vr4, Vr6, . . . , Vr28, Vr30 are applied to D/A converter 13 to be output as reference potentials used for subtraction corresponding to 1, 2, 3, . . . , 14, 15 LSB, respectively. Reference potential VRM is applied to SH.SBT14. Reference potentials Vr15, VRM, Vr17 are applied to SH.R15.

Figure 4:
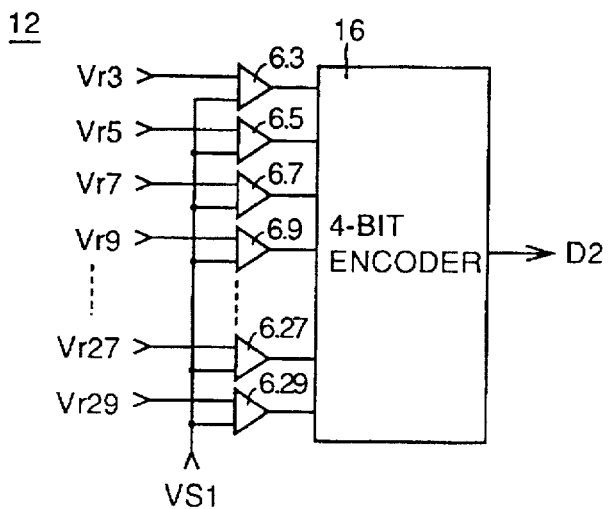
FIG. 4 is a circuit block diagram showing a structure of an A/D converter 12 of FIG. 12 with a portion thereof omitted.

As shown in FIG. 4, A/D converter 12 includes 14 potential comparators 6.3, 6.5, . . . , 6.29 and a 4-bit encoder 16. Reference potentials Vr3, Vr5, . . . , Vr29 become the reference potentials for comparison of potential comparators 6.3, 6.5, . . . , 6.29, respectively. Potential comparators 6.3, 6.5 . . . , 6.29 compare reference potentials Vr3, Vr5, . . . , Vr29 with analog potential VS1 to provide a signal according to the comparison result to encoder 16. Encoder 16 generates and provides to logic circuit 5 a digital code D2 of 4 bits according to the signals applied from potential comparators 6.3, 6.5, . . . , 6.29.

Figure 5:
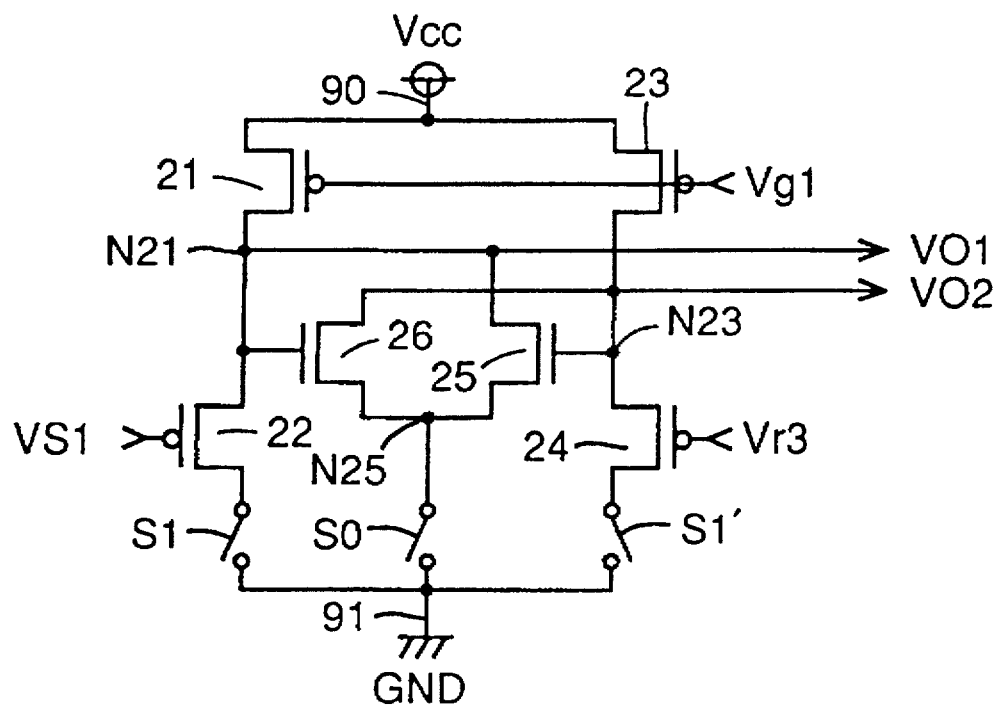
FIG. 5 is a circuit diagram showing a structure of a potential comparator 6.3 of FIG. 4.

As shown in FIG. 5, potential comparator 6.3 includes P channel MOS transistors 21–24, N channel MOS transistors 25, 26, and switches S0, S1, and S1'. Each of switches S0, S1, and S1' is formed of, for example, a MOS transistor. P channel MOS transistors 21 and 22 and switch S1, and P channel MOS transistors 23, 24 and switch S1' are respectively connected in series between power supply line 90 and ground line 91.

N channel MOS transistor 25 and switch S0 are connected in series between the drain (output node N21) of P channel MOS transistor 21 and ground line 91. N channel MOS transistor 25 has its gate connected to the drain (output node N23) of P channel MOS transistor 23. N channel MOS transistor 26 is connected between node N23 and the source (node N25) of N channel MOS transistor 25, and has its gate connected to node N21.

Figure 6:
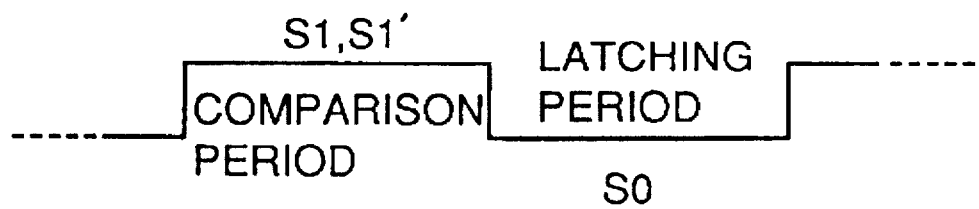
FIG. 6 is a timing chart for describing an operation of potential comparator 6.3 of FIG. 5.

Analog potential VS1 and reference potential Vr3 are applied to the respective gates of MOS transistors 22 and 24, respectively. A constant potential Vg1 is applied to the gates of MOS transistors 21 and 23. Each of MOS transistors 21 and 23 operates as a constant current source. As shown in FIG. 6, switches S1 and S1' conduct and switch S0 is rendered non-conductive during a comparison period. During a latching period, switches S1 and S1' are rendered non-conductive, and switch S0 conducts.

In a comparison period, switches S1 and S1' conduct, so that P channel MOS transistors 21–24 form a source follower circuit. Potentials VO1 and VO2 corresponding to input potential VS1 and comparison reference potential Vr3 are output to output nodes N21 and N23. The gain of the source follower circuit takes a value approximating and lower than 1. Since the change in difference between input potential VS1 and output potential VO1, and the difference between reference potential Vr3 and output potential VO2 is small, the input capacitance of potential comparator 6.3 is small. In A/D converter block 1, VRT−VRB=1V, so that the accuracy (resolution) of 4 bits is to be satisfied. The accuracy required for potential comparator 6.3 is $1V/2^4/2=31.25$ mV. During a comparison period, switch SO is rendered non-conductive, so that the sources of MOS transistors 25 and 26 are disconnected from ground line 21. Therefore, MOS transistors 25 and 26 do not operate.

During a latch period, switch S0 is rendered conductive, and switches S1 and S1' are rendered non-conductive. As a result, P channel MOS transistors 22 and 24 do not operate since they are disconnected from ground line 9. P channel MOS transistors 25 and 26 are connected to ground line 91 to increase the difference between output potentials VO1 and VO2, whereby output potentials VO1 and VO2, i. e., the comparison result, are defined quickly. Th defined comparison result is applied to encoder 16 and to D/A converter 13. The other potential comparators 6.5, 6.7, . . . , 6.29 have a structure similar to that of potential comparator 6.3, provided that Vr5, Vr7, . . . , Vr29 are respectively applied instead of reference potential Vr3.

Figure 7:
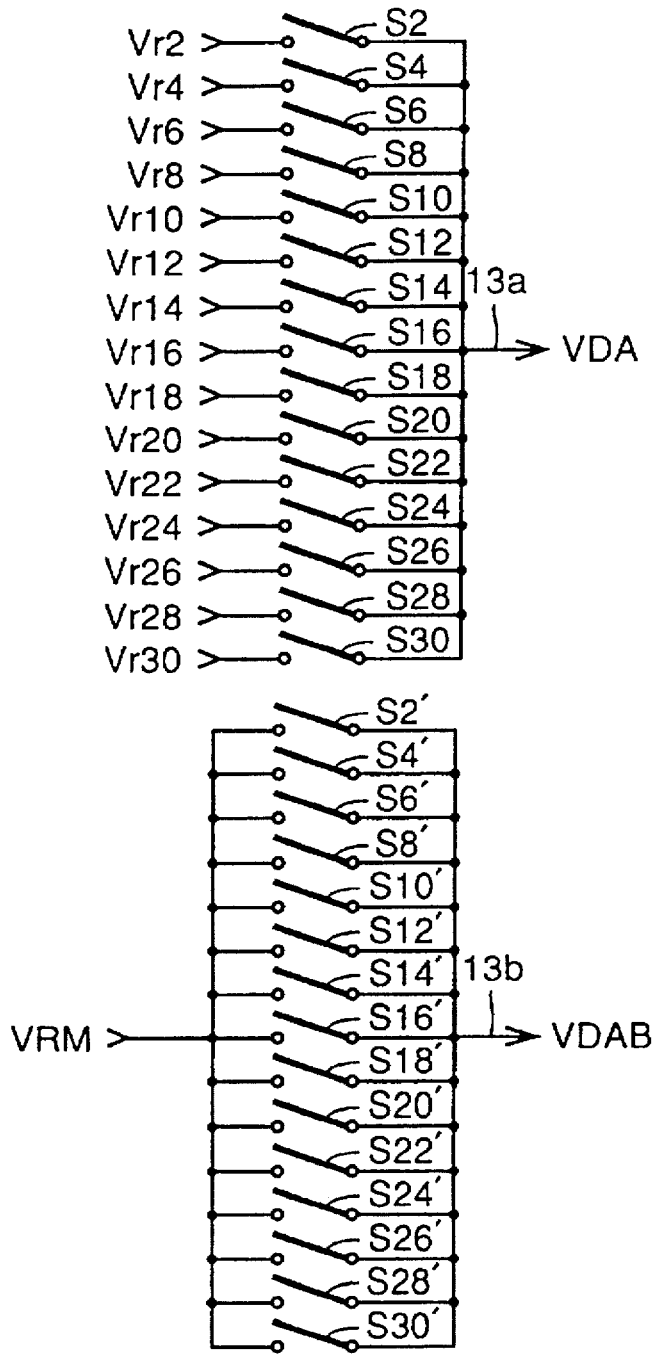
FIG. 7 is a circuit diagram showing a structure of a D/A converter 13 of FIG. 2.

As shown in FIG. 7, D/A converter 13 includes two output nodes 13a and 13b, and switches S2, S4, . . . , S30; S2', S4', . . . , S30'. Each of switches S2, S4, . . . , S30; S2', S4', . . . , S30' is formed of, for example, a MOS transistor. Switches S2, S4, . . . , S30 have their one electrodes receive reference potentials Vr2, Vr4, . . . , Vr30, respectively, from reference potential generation circuit 11, and the other electrode connected to output node 13a. Switches S2', S4', . . . , S30' have their one electrode receive reference potential VRM, and the other electrode connected to output node 13b. Switches S2', S4', . . . , S30' are provided for the purpose of applying a noise to VDAB identical to that of VDA.

In response to the comparison results of potential comparators 6.3, 6.5, . . . , 6.9 of FIG. 4, one of switches S2, S4, . . . , S30 (for example S28), and a corresponding one of switches S2', S4', . . . , S30' (switch S28') are rendered conductive, whereby output potentials VDA and VDAB (in this case, Vr28, and VRM) are applied to each of output nodes 13a and 13b. Output potential VDA attains a level according to the following rule in response to input potential VS1. More specifically, output potential VDA attains the level of Vr2 when VS1<Vr3, attains Vr4 when Vr3<VS1<Vr5, attains Vr6 when Vr5<VS1<Vr7, attains Vr8 when Vr7<VS1<Vr9, . . . , attains Vr28 when Vr27<VS1<Vr29, and attains Vr30 when Vr29<VS1.

Figure 8:
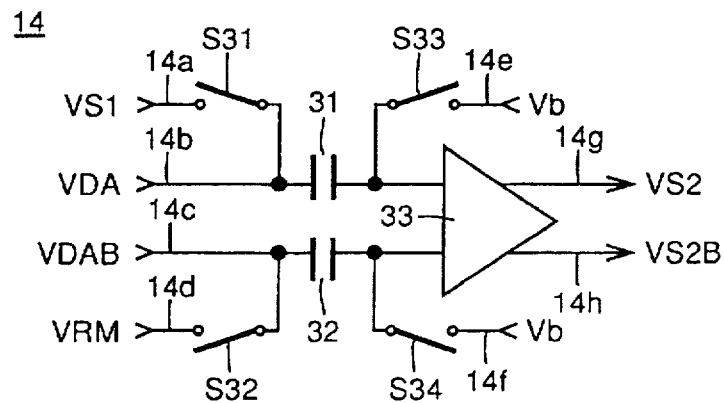
FIG. 8 is a circuit block diagram showing a structure of a SH.SBT14 of FIG. 2.

As shown in FIG. 8, SH.SBT14 includes four input nodes 14a–14d receiving potentials VS1, VDA, VDAB, and VRM, respectively, bias potential input nodes 14e and 14f both receiving a bias potential Vb, two output nodes 14g and 14h, switches S31–S34, capacitors 31 and 32, and a differential amplifier 33. Each of switches S31–S34 is formed of, for example, a MOS transistor.

One electrode of capacitor 31 is connected to input node 14a via switch S31, and directly to input node 14b. The other electrode of capacitor 31 is connected to bias potential input node 14e via switch S33, and to one input node 33a of differential amplifier 33. One electrode of capacitor 32 is connected to input node 14d of switch S32, and directly to input node 14c. The other electrode of capacitors 32 is connected to bias potential input node 14f via switch S34, and to the other input node 33b of differential amplifier 33. The two output nodes of differential amplifier 33 are the output nodes 14g and 14h, respectively, of SH.SBT14.

SH.SBT14 samples input potential VS1 and reference potential VRM to subtract output potentials VRA and VRAB (VRM) of D/A converter 13 from the sampled VS1 and VRM. The subtracted values are held in SH.SBT14. Output potentials VS2 and VS2B are VS1−VDA, VRM−VDAB, respectively.

Figure 9:
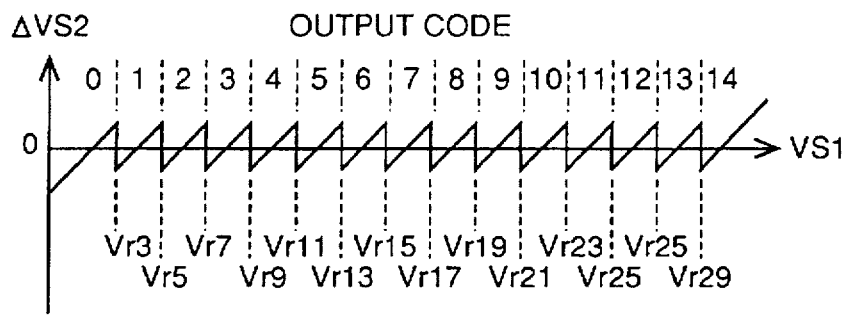
FIG. 9 shows the relationship between an analog potential VS1 applied to SH.SBT14 of FIG. 8 and output voltage ΔVS2.

FIG. 9 shows the relationship between input potential VS1 of SH.SBT14 and output voltage ΔVS2=VS2−VS2B. For example, when VS1 is equal to Vr28, ΔVS2=0. When VS1 is greater than Vr28 and smaller than Vr29, ΔVS2 is a positive voltage. When VS1 is smaller than Vr28 and greater than Vr27, ΔVS2 is a negative voltage. In all these cases, encoder 16 of FIG. 4 provides an output code 13. ΔVS2 is provided to A/D converter block 2 of the succeeding stage.

Figure 10:
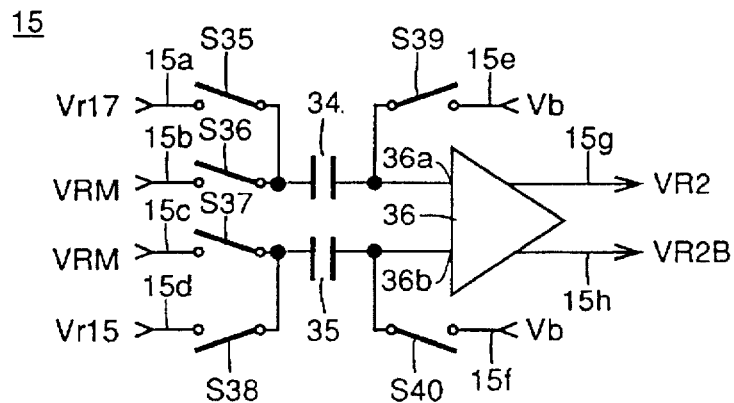
FIG. 10 is a circuit block diagram showing a structure of a SH.R15 of FIG. 2.

As shown in FIG. 10, SH.R15 includes four input nodes 15a–15d, receiving reference potentials Vr17, VRM, VRM, and Vr15, respectively, bias potential input nodes 15a and 15f both receiving a bias potential Vb, two output nodes 15g and 15h, six switches S35–S40, capacitors 34 and 35, and a differential amplifier 36. Each of switches S35–S40 is formed of, for example, a MOS transistor.

One electrode of capacitor 34 is connected to input node 15a via switch S35, and to input node 15b via switch S36. The other electrode of capacitor 34 is connected to bias potential input node 15e via switch S39, and to one input node 36a of differential amplifier 36. One electrode of capacitor 35 is connected to input node 15c via switch S37, and to input node 15d via switch S38. The other electrode of capacitor 35 is connected to bias voltage input node 15f via switch S41, and to the other input node 36b of differential amplifier 36. The two output nodes of differential amplifier 36 are output nodes 15g and 15h of SH.R15.

SH.R15 samples reference potentials Vr17 and Vr15 to hold the sampled reference potentials by reference potential VRM. Output potentials Vr2 and VR2B become Vr17−VRM and Vr15−VRM, respectively. Output ΔVR2 of SH.R15 becomes VR2−VR2B=Vr17−Vr15. This corresponds to 1 LSB of A/D converter block 1 of the first stage. ΔVR2 is used for generating a reference voltage at A/D converter block 2 of the next stage.

Figure 11:
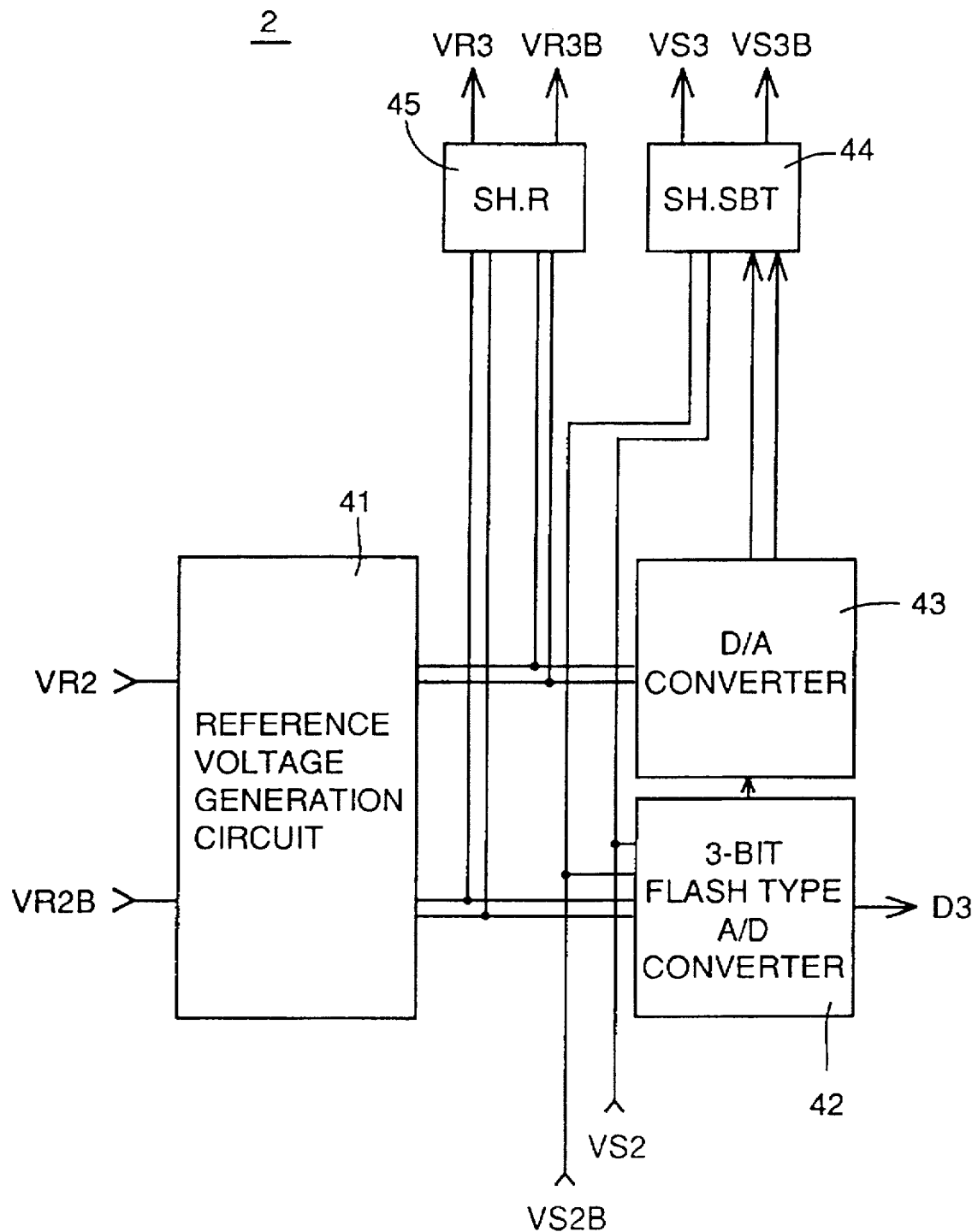
FIG. 11 shows a structure of an A/D converter block 2 of the second stage shown in FIG. 1.

Referring to FIG. 11, A/D converter block 2 includes a reference voltage generation circuit 41, a 3-bit flash type A/D converter 42, a D/A converter 43, a SH.SBT44 and a SH.R45.

Figure 12:
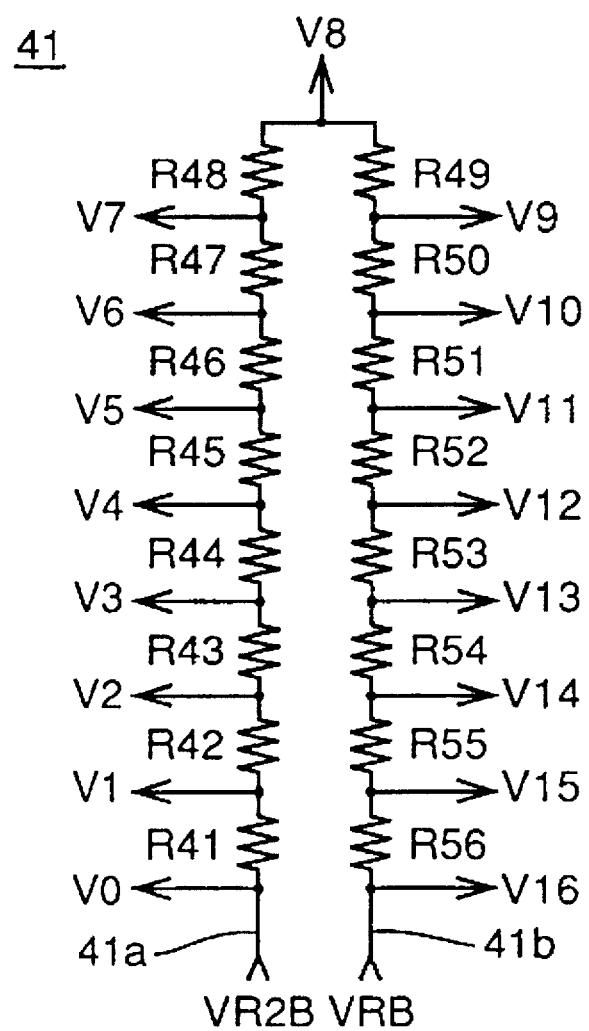
FIG. 12 is a circuit diagram showing a structure of a reference voltage generation circuit 41 of FIG. 11.

As shown in FIG. 12, reference voltage generation circuit 41 includes sixteen resistor elements R41−R56 connected in series between a low potential end terminal 41a and a high potential end terminal 41b. The sixteen resistor elements R41−R56 have the same resistance value. Output potentials VR2B (V0) and VR2 (V16) of SH.R15 of A/D converter block 1 of the preceding stage are applied to low potential end terminal 41a and high potential end terminal 41b, respectively. Each of resistor elements R41−R55 output reference potentials V1−V15 from the node of each high potential end. Reference voltages Vr0'−Vr16' represented by the following equations are generated from reference potentials V0−V16, respectively.

Vr0'=V0−V16

Vr1'=V1−V15

Vr2'=V2−V14

Vr3'=V3−V13

Vr4'=V4−V12

Vr5'=V5−V11

Vr6'=V6−V10

Vr7'=V7−V9

Vr8'=V8−V8

Vr9'=V9−V7

Vr10'=V10−V6

Vr11'=V11−V5

Vr12'=V12−V4

Vr13'=V13−V3

Vr14'=V14−V2

Vr15'=V15−V1

Vr16'=V16−V0

Reference voltages Vr3', Vr5', . . . , Vr13' become the reference voltages for comparison of A/D converter 42. Reference voltages Vr2', Vr4', . . . , Vr14' become the output voltage of D/A converter 43. Reference potentials V6, V8, and V10 are applied to SH.R45.

Figure 13:
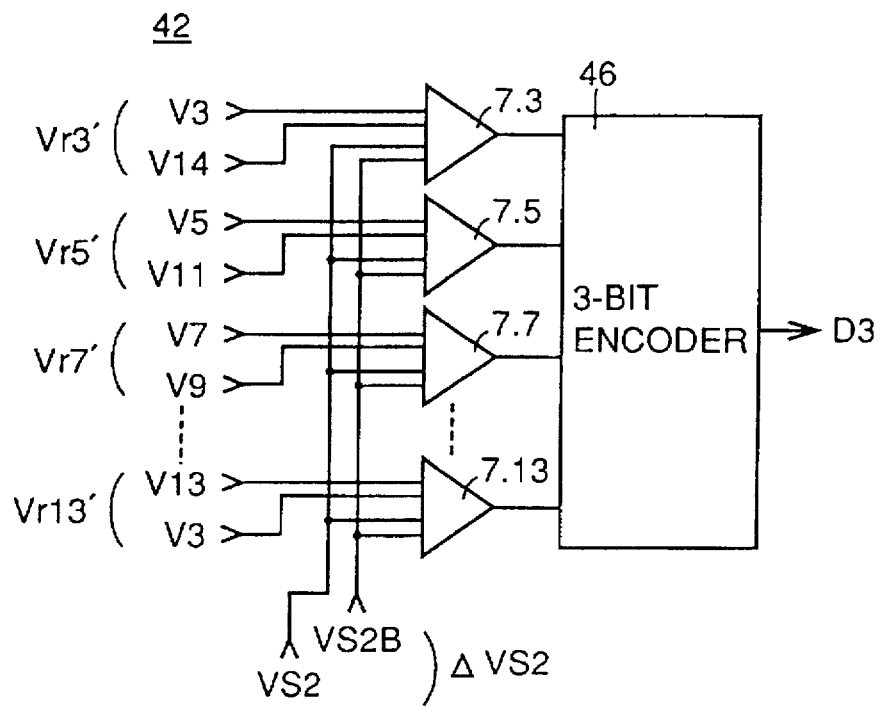
FIG. 13 is a circuit diagram showing a structure of an A/D converter 42 of FIG. 11 with a portion thereof omitted.

As shown in FIG. 13, A/D converter 42 includes six voltage comparator circuits 7.3, 7.5, . . . , 7.13, and a 3-bit encoder 46. Reference voltages Vr3', Vr5', . . . , Vr13' become the reference voltage for comparison of voltage comparator circuits 7.3, 7.5, . . . , 7.13, respectively. Voltage comparator circuits 7.3, 7.5, . . . , 7.13 compares reference voltages Vr3', Vr5', . . . , Vr13' with output voltage ΔVS2 (=VS2−VS2B) of SH.SBT14 of A/D converter block 1 of the preceding stage to provide a signal according to the comparison result to encoder 46. Encoder 46 generates and provides to logic circuit 5 a digital code D3 of 3 bits according to the signals provided from voltage comparator circuits 7.3, 7.5, . . . , 7.13.

Figure 14:
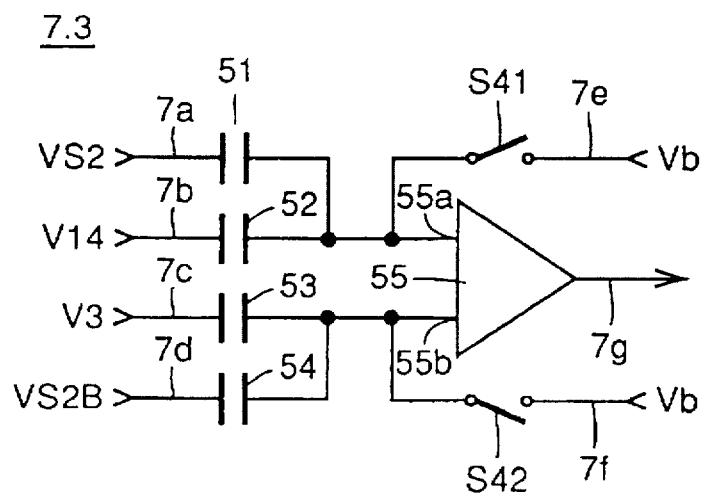
FIG. 14 is a circuit block diagram showing a structure of a voltage comparator circuit 7.3 of FIG. 13.

As shown in FIG. 14, voltage comparator circuits 7.3 includes four input nodes 7a−7d receiving potentials VS2, V14, V3 and VS2B, respectively, bias potential input nodes 7e and 7f to which a bias potential Vb is applied, an output node 7g, four capacitors 51−54, two switches S41 and S42, and a potential comparator 55. Each of switches S41 and S42 is formed of, for example, a MOS transistor.

Capacitors 51 and 52 are connected between respective input nodes 7a and 7b and input node 55a of potential comparator 55. Capacitors 53 and 54 are connected between respective input nodes 7c and 7d and the other input node 55b of voltage comparator 55. Switch S41 is connected between bias potential input node 7e and one input node 55a of potential comparator 55. Switch S42 is connected between bias potential input node 7f and the other input node 55b of potential comparator 55. The output node of potential comparator 55 becomes output node 7g of voltage comparator circuit 7.3.

By comparing potentials of input nodes 55a and 55b of voltage comparator 55 after capacitors 51−54 are charged, the magnitude level of VS2−VS2B and V3−V14 can be determined. The determination result is applied to encoder 46 and D/A converter 43. Other voltage comparator circuits 7.5, 7.7, . . . , 7.13 have a structure similar to that of voltage comparator circuit 7.3 provided that respective potentials Vr5', Vr7', . . . , Vr13' are applied instead of comparator voltage Vr3'.

Figure 15:
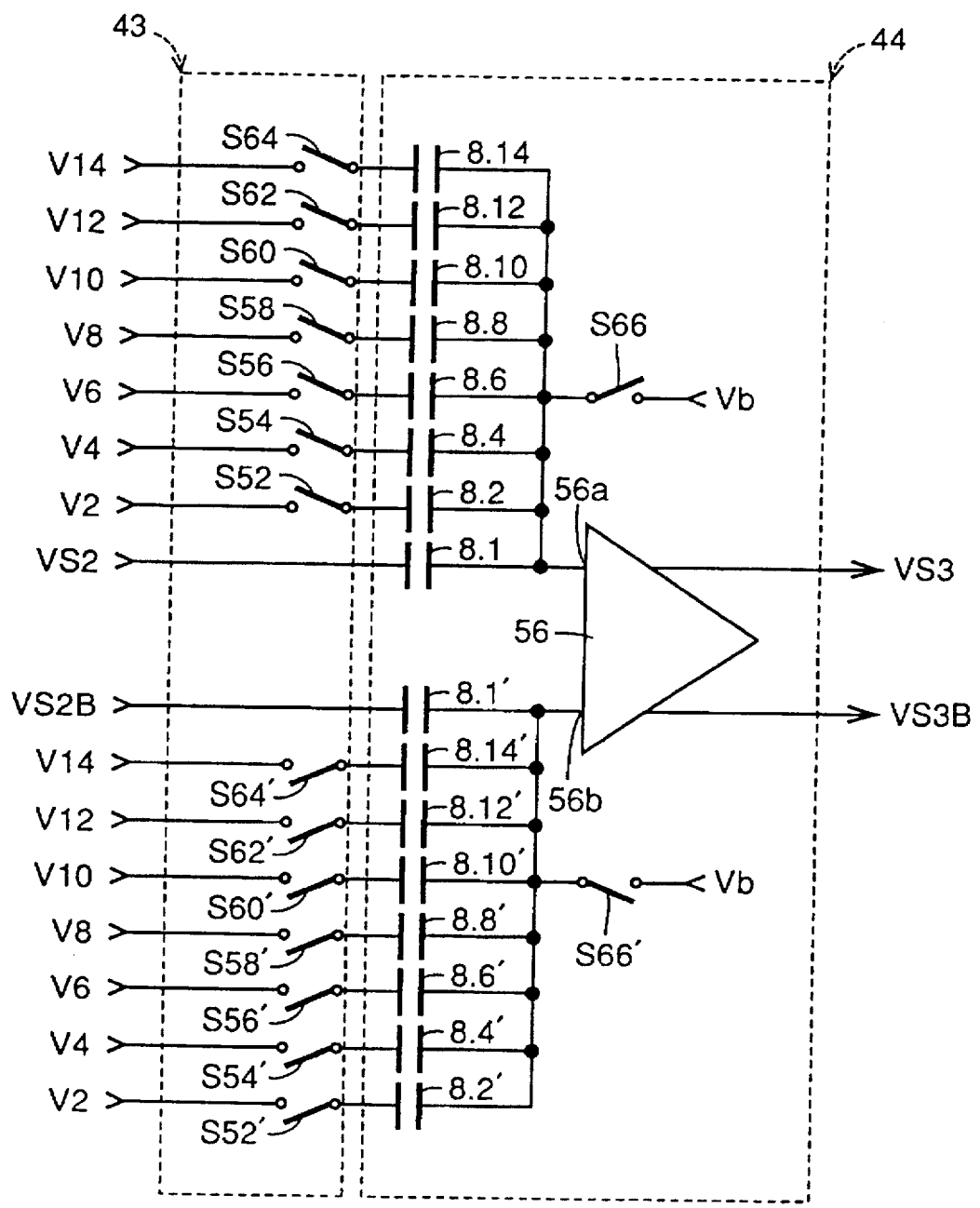
FIG. 15 is a circuit block diagram showing a structure of a D/A converter 43 and SH.SBT44 of FIG. 11.

Referring to FIG. 15, D/A converter 43 includes switches S52, S54, . . . , S64; S52', S54', . . . , S64'. Each of switches S52, S54, . . . , S64; S52', S54', . . . , S64' is formed of, for example, a MOS transistor. SH.SBT44 includes capacitors 8.1, 8.2, 8.4, . . . , 8.14; 8. 1', 8.2', 8.4', . . . , 8.14', switches S66 and S66', and a differential amplifier 56. Each of switches S66 and S66' is formed of, for example, a MOS transistor.

Switches S52, S54, . . . , S64 have one terminal receive reference potentials V2, V4, . . . , V14, respectively, and the other terminal connected to respective one electrodes of capacitors 8.2, 8.4, . . . , 8.14. The other electrodes of capacitors 8.2, 8.4, . . . , 8.14 are connected to one input node 56a of differential amplifier 56.

Switches S52', S54', . . . , S64' have each one terminal receive reference potentials V2, V4, . . . , V14, and each other terminal connected to respective one electrodes of capacitors 8.2', 8.4', . . . , 8.14'. The other electrodes of capacitors 8.2', 8.4', . . . , 8.14' are connected to the other input node 56b of differential amplifier 56.

Capacitors 81.1 and 8.1' have each one electrode received output potentials VS2 and VS2B, respectively, of SH.SBT14 of A/D converter block 1 of the preceding stage, and the each other electrode connected to input nodes 56a and 56b, respectively, of differential amplifier 56. Switches S66 and S66' have each one terminal receive bias potential Vb, and each other terminal connected to input nodes 56a and 56b, respectively, of differential amplifier 56.

According to the comparison results of voltage comparator circuits 7.3, 7.5, . . . , 7.13 of FIG. 13, any of switches S52, S54, . . . , S64 (for example switch S54), and a corresponding one of switches S52', S54', . . . , S64' (switch S62') conduct, whereby reference voltage Vr12'=V12−V4 is applied to SH.SBT44. SH.SBT44 subtracts reference voltage Vr12'=V12−V4 from output voltage ΔVS2=VS2−VS2B of SH.SBT14 of A/D converter block 1 of the prior stage to provide the subtracted result ΔVS3=VS3-VS3B to A/D converter block 3 of the succeeding stage.

Figure 16A:
FIG. 16A shows the relationship between a voltage ΔVS2 applied from a preceding stage and an output code of A/D converter 42.
Figure 16B:
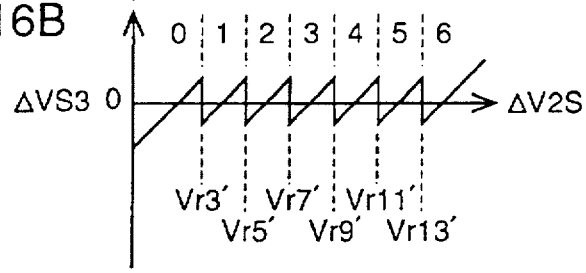
FIG. 16B shows the relationship between voltage ΔVS2 applied from a preceding stage and an output voltage ΔVS3 of SH.SBT44.

It is appreciated from FIGS. 16A and 16B that ΔVS3=0 when ΔVS2 is equal to Vr12'. When ΔVS2 is greater than Vr12' and smaller than Vr13', ΔVS3 takes a positive voltage. When ΔVS2 is smaller than Vr12' and greater than Vr11', ΔVS3 takes a negative voltage. In any case, encoder 45 of FIG. 13 provides an output code 5.

Figure 17:
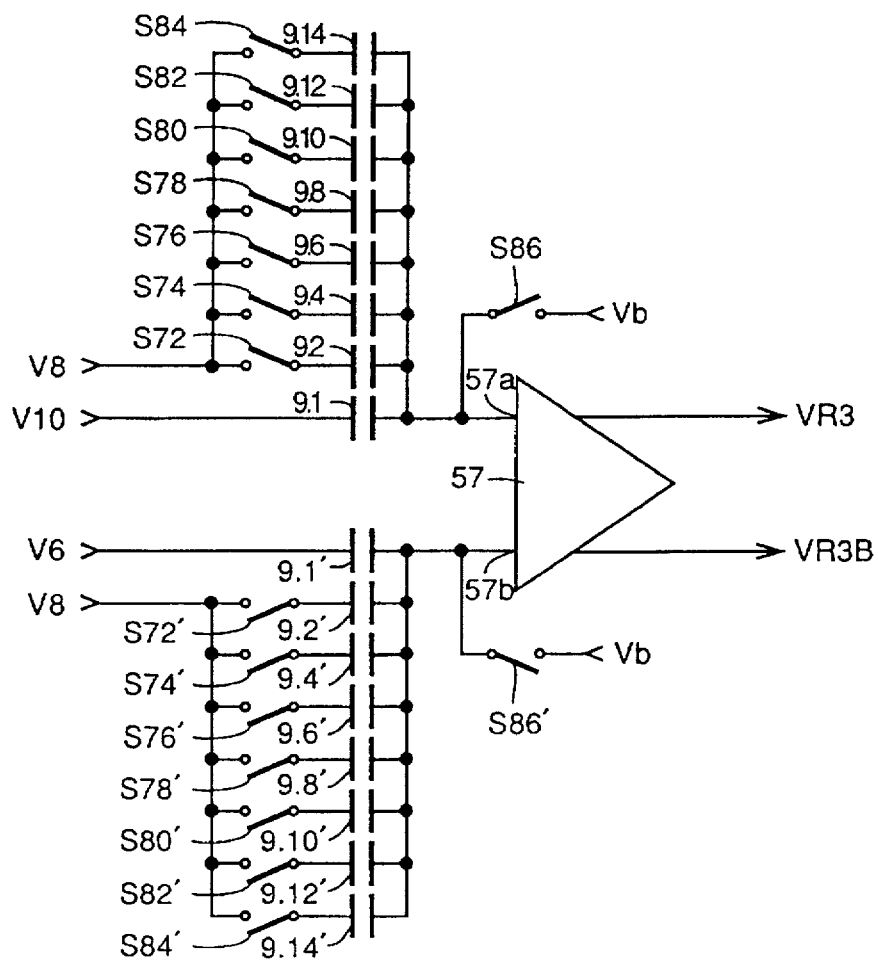
FIG. 17 is a circuit diagram showing a structure of SH.R45 of FIG. 11.

Referring to FIG. 17, SH.R45 includes switches S72, S74, ..., S84, S86; S72', S74', ..., S84', S86', capacitors 9.1, 9.2, 9.4, ..., 9.14; 9.1', 9.2', 9.4', ..., 9.1', and a differential amplifier 47. Each of switches S72, S74, ..., S84, S86; S72', S74', ..., S84', S86' is formed of, for example, a MOS transistor.

Switches S72, S74, ..., S84 have each one terminal receive reference potential V8, and each other terminal connected to respective one electrodes of capacitors 9.2, 9.4, ..., 9.14. The other electrodes of capacitors 9.2, 9.4, ..., 9.14 are connected to one input node 57a of differential amplifier 57.

Switches S72', S74', ..., S84' have each one terminal receive reference potential V8, and each other terminal connected to respective one electrodes of capacitors 9.2', 9.4', ..., 9.14'. The other electrodes of capacitors 9.2', 9.4', ..., 9.14' are connected to the other input node 57b of differential amplifier 57.

Capacitors 9.2', 9.4', ..., 9.14' have each one electrode receive reference potentials V10 and V6, and each other electrode connected to input nodes 57a and 57b of differential amplifier 57. Switches S86 and S86' have each one electrode receive bias potential Vb and each other terminal connected to input nodes 57a and 57b of differential amplifier 57.

SH.R45 samples reference potentials V10 and V6 to hold the sampled reference potentials by the reference potential V8. Output potentials VR3 and VR3B of SH.R45 become V10-V8 and V6-V8, respectively. As a result, ΔVR3=VR3-VR3B=V10-V6. This corresponds to 1 LSB of A/D converter block 2 of the second stage. ΔVR3 is used for generating a reference voltage at A/D converter block 3 of the next stage.

Figure 18:
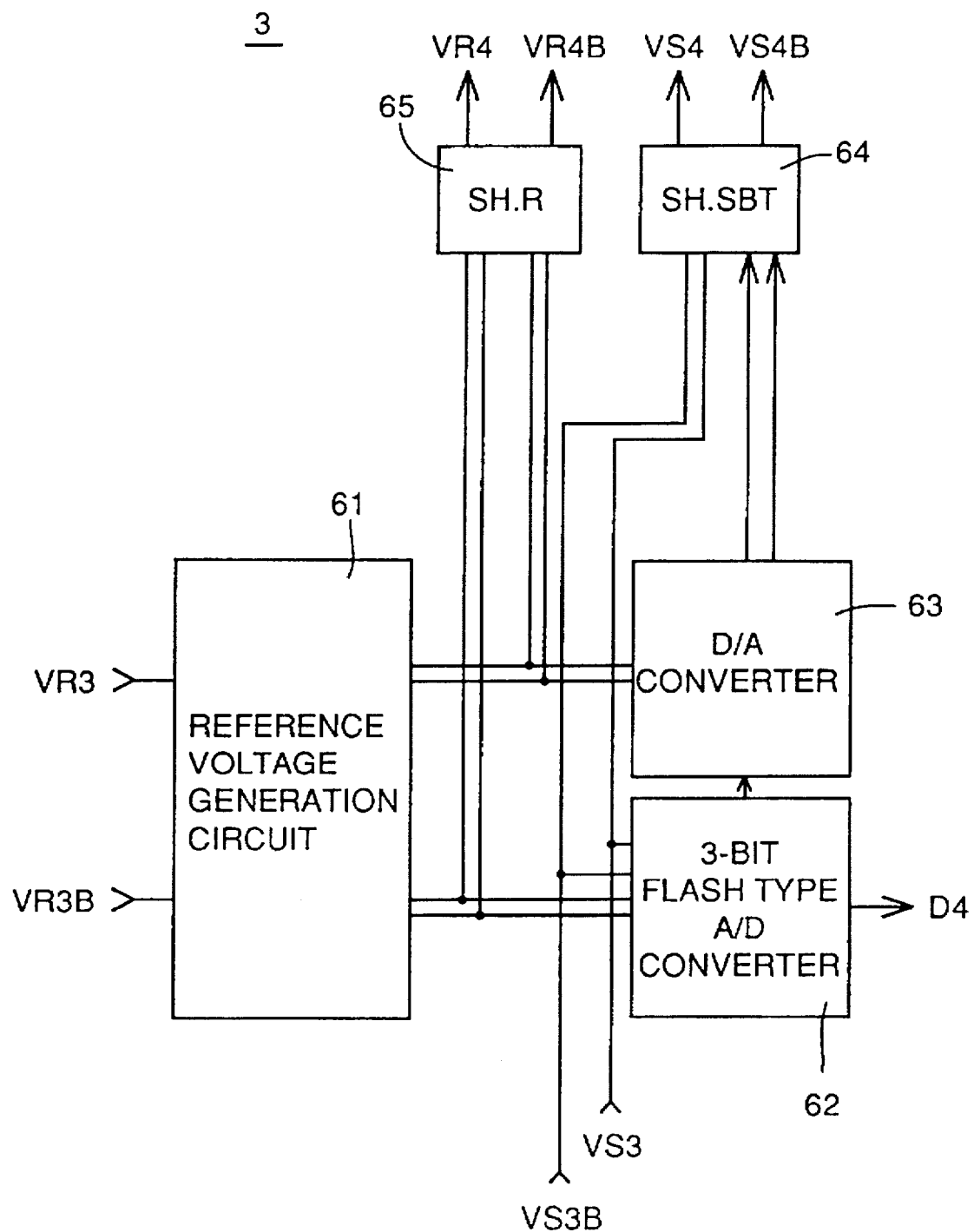
FIG. 18 shows a structure of an A/D converter block 3 of the third stage of FIG. 1 with a portion thereof omitted.

Referring to FIG. 18, A/D converter block 3 includes a reference voltage generation circuit 61, a 3-bit flash type A/D converter 62, a D/A converter 63, a SH.SBT64, and a SH.R65.

A/D converter block 3 has a structure similar to that of A/D converter block 2 provided that VS2, VS2B, VR2, VR2B, VS3, VS3B, D3 are replaced with VS3, VS3B, VR3, VR3B, VS4, VS4B, VR4, VR4B, D4.

Figure 19:
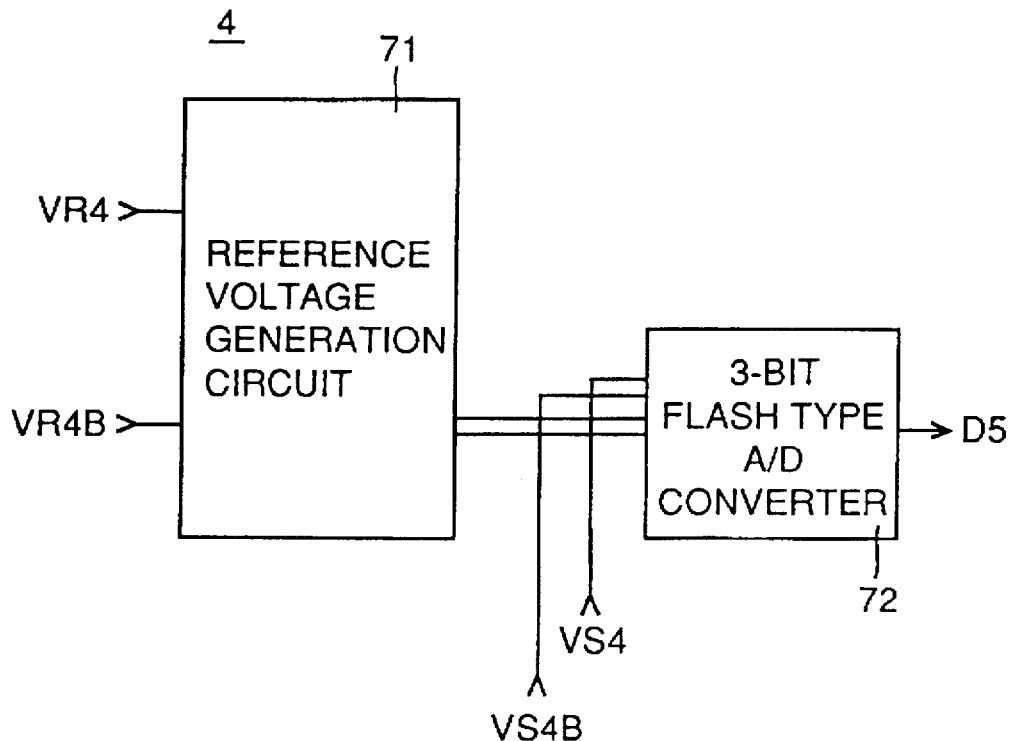
FIG. 19 is a block diagram showing a structure of an A/D converter block 4 at the last stage of FIG. 1 with a portion thereof omitted.
Figure 20:
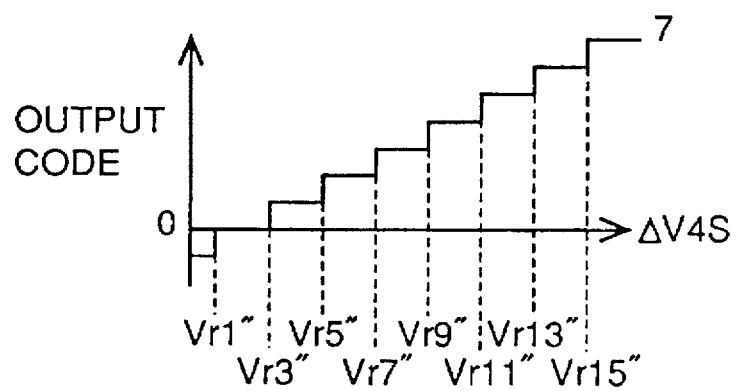
FIG. 20 shows the relationship between a voltage ΔVS4 applied from a preceding stage and an output code of an A/D converter 72.
Figure 21:
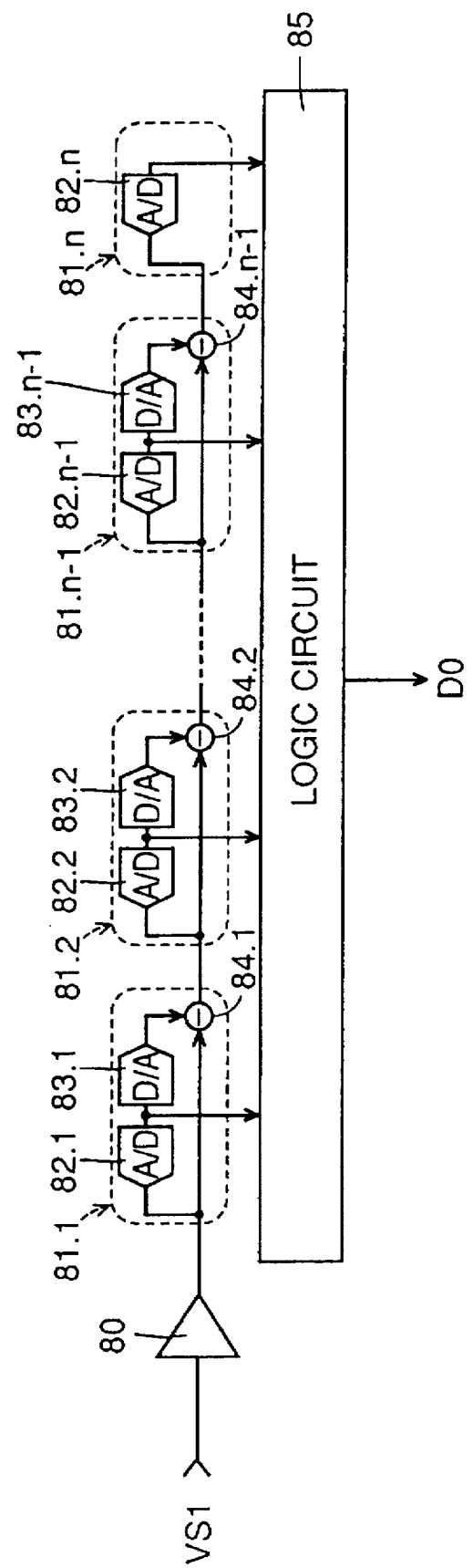
FIG. 21 is a circuit block diagram showing a structure of a conventional pipeline type A/D converter with a portion thereof omitted.
Figure 22:
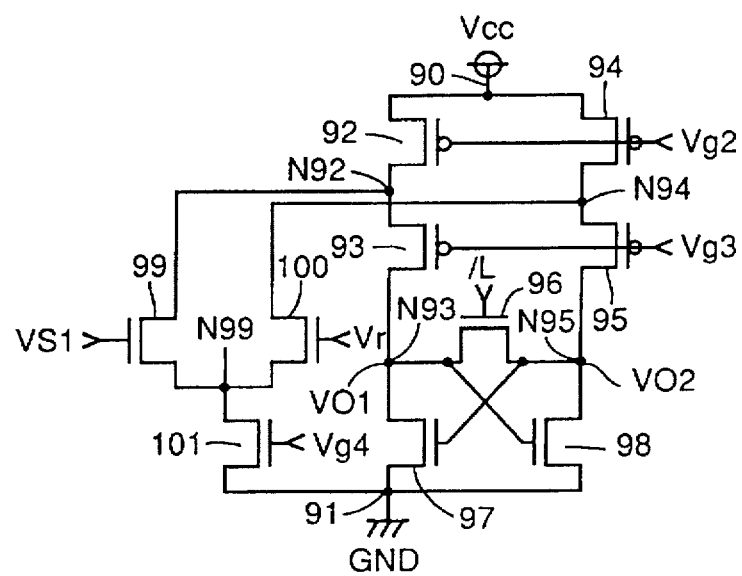
FIG. 22 is a circuit diagram showing a structure of a potential comparator included in an A/D converter 82.1 of FIG. 21.
Figure 23:
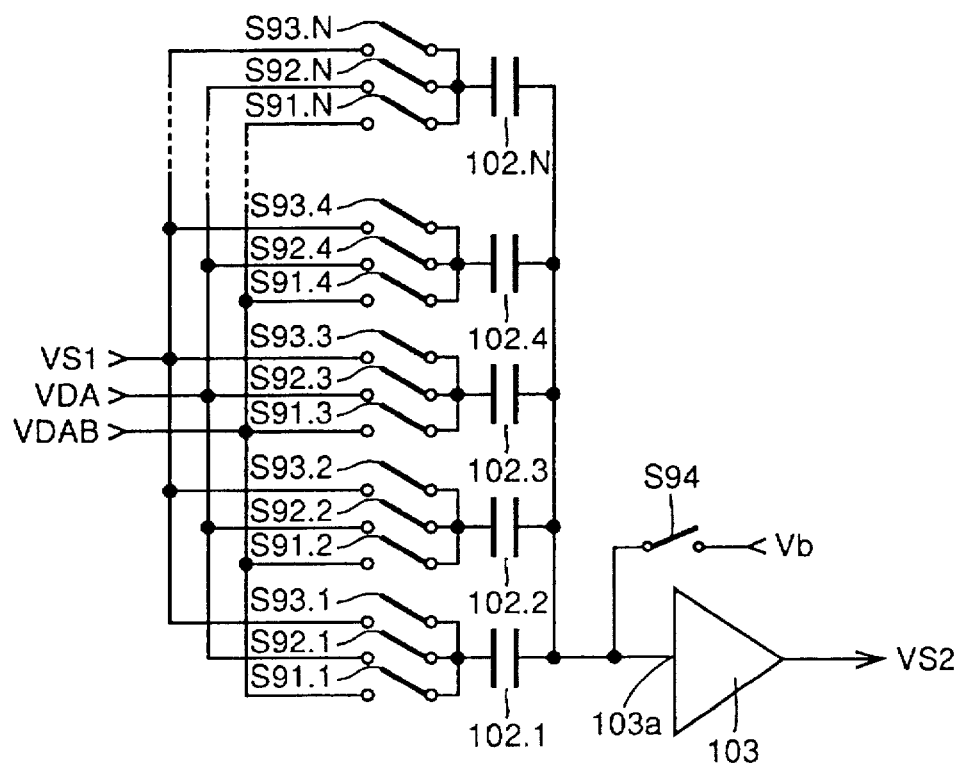
FIG. 23 is a circuit block diagram showing a structure of a subtracter circuit 84.1 of FIG. 21 with a portion thereof omitted.

Referring to FIG. 19, A/D converter block 4 of the last stage includes a reference voltage generation circuit 71, and a 3-bit flash type A/D converter 72. Reference voltage generation circuit 71 has a structure similar to those of reference voltage generation circuits 41 and 61 of A/D converter blocks 2 and 3, provided that reference voltage generation circuit 71 applies reference voltages Vr1", Vr3", Vr5", ..., Vr15" to A/D converter 72. As shown in FIG. 20, A/D converter 72 outputs −1 when VS4−VS4B= ΔVS4<Vr1", 0 when Vr1"<ΔVS4<Vr3", 1 when Vr3"<ΔVS4<Vr5", ..., 6 when Vr13"<ΔVS4<Vr15", and 7 when Vr15"<ΔVS4.

The operation of the pipeline type A/D converters shown in FIGS. 1-20 will be described hereinafter. A pipeline type A/D converter operates in two phases that are switched alternately in synchronization with a clock signal. One of the two phases is executed at a period when the clock signal attains an H level (logical high), and the other of the two phases is executed at a period when the clock signal attains an L level (logical low).

(First Phase of A/D Converter Block 1 of First Stage)

In the first phase of A/D converter block 1, analog potential VS1 is applied to A/D converter 12 and SH.SBT14. In A/D converter 12, reference potentials Vr3, Vr5, ..., Vr29 are compared with input potential VS1.

In potential comparator 6.3 of FIG. 5, switches S1 and S1' are rendered conductive, and switch S0 is rendered non-conductive, whereby MOS transistors 21~24 form a source follower circuit. MOS transistors 25 and 26 do not operate. When VS1 is higher than Vr3, VO1 becomes higher than VO2. When VS1 is lower than Vr3, VO1 becomes lower than VO2. The same applies for other potential comparators 6.5, 6.7, ..., 6.29.

In SH.SBT14 of FIG. 8, switches S31 and S32 conduct, whereby input potential VS1 and reference potential VRM are applied to capacitors 31 and 32, respectively. Here, switches S2, S4, ..., S30; S2', S4', ..., S30' in D/A converter 13 of FIG. 7 are rendered non-conductive. The potentials applied to capacitors 31 and 32 are only input potential VS1 and reference potential VRM. Also, switches S33 and S34 are rendered conductive, whereby bias potential Vb is applied to input nodes 33a and 33b amplifier 33. More specifically, SH.SBT14 is in a sample state, and capacitors 31 and 32 are charged by Vb, VS1 and Vb and VRM.

In SH.R15, switches S36 and S37 are rendered conductive, and switches S35, S38, S39, and S40 are rendered non-conductive. VRM is connected to capacitors 34 and 35. Input nodes 36a and 36b of amplifier 36 of SH.R15 attain a high impedance state. SH.R15 holds the voltage sampled at the prior phase.

Amplifier 33 of SH.SBT14 and amplifier 36 of SH.R15 amplify the voltages on respective input nodes 33a, 33b, 36a and 36b to provide the amplified voltage to A/D converter block 2 of the next stage.

[Second Phase of A/D Converter Block 1 of First Stage]

When switched to the second phase, the comparator result of A/D converter 12 is defined. At potential comparator 6.3 of FIG. 5, switches S1 and S1' are rendered non-conductive, and switch S0 is rendered conductive. MOS transistors 22 and 24 do not operate. MOS transistors 25 and 26 operate to increase the difference between output potentials VO1 and VO2. The same applies to other potential comparators 6.5, 6.7, ..., 6.29.

The outputs of potential comparators 6.3, 6.5, ..., 6.29 are applied to encoder 16 and D/A converter 13 of FIG. 4. Output D2 of encoder 16 becomes the digital code of 4 bits. The outputs of potential comparators 6.3, 6.5, ..., 6.29 renders conductive any of switches S2, S4, ..., S30 (for example S28) of FIG. 7, and renders conductive any corresponding one of switches S2', S4', ..., S30' (switch S28'). D/A converter 13 provides selected reference potentials Vr28 and VRM as VDA and VDAB.

Output potentials VDA and VDAB of D/A converter 13 are supplied to SH.SBT14. In the second phase, switches S31~S34 attain a non-conductive state. Input potential VS1 and reference potential VRM sampled at the first phase are subtracted by output potentials VDA and VDAB of D/A converter 13 to be held. The held potential is amplified by amplifier 33 to be supplied to A/D converter block 2 of the next stage.

In SH.R15, switches S35, S38~S40 are rendered conductive, and switches S36 and S37 are rendered non-conductive. The two capacitors 34 and 35 of SH.R15 are charged by Vr14=VRM+0.5 LSB and Vb and Vr15=VRM−

0.5 LSB and Vb respectively. Therefore, sampling will be carried out with the 1 LSB as the differential voltage in SH.R15. This voltage is held by VRM in the first phase.

[First Phase of A/D Converter Block 2 of Second Stage]

In the following, VS2, VS2B, VR2, VR2B in the first phase are represented to as VS2__1, VS2B__1, VR2__1, VR2B__1. Similarly, VS2, VS2B, VR2, VR2B in the second phase are represented as VS2__2, VS2B__2, VR2__2, VR2B__2. Also, S2__1−VS2B__1=ΔVS2__1, VR2__1−VR2__$_{1=\Delta VR2\_1}$1, VS2__2−VS2B__2=ΔVS2__2, VR2__2−VR2B__2=ΔVR2__2.

A differential voltage ΔVS2__1 from A/D converter block 1 of the prior stage is the output offset voltage of amplifier 33 since Vb is applied to input nodes 33a and 33b of amplifier 33 of SH.SBT14. Differential voltage ΔVR2__1 includes a voltage corresponding to 1 LSB of A/D converter block 1 and the output offset voltage of amplifier 36 of SH.R15 of A/D converter block 1. ΔVS2 is applied to A/D converter 42 and SH.SBT44 of A/D converter block 2. ΔVR2 is applied to reference voltage generation circuit 41.

Reference voltage generation circuit 41 divides voltage ΔVR2__1 that includes a voltage corresponding to 1 LSB of A/D converter block 1 and the output offset voltage of amplifier 36 of SH.R15 of A/D converter block 1 to generate reference voltages Vr3', Vr5', ..., Vr13' for comparison and reference voltages Vr2', Vr4', ..., Vr14' for D/A. Comparison reference voltages Vr3', Vr5', ..., Vr13' are supplied to A/D converter 42. Subtraction reference voltages Vr2', Vr4', ..., Vr14' are applied to D/A converter 43. Reference potentials V6, V8, and V10 of the reference potentials generated by reference voltage generation circuit 41 are also applied to SH.R45 of A/D converter block 2.

In voltage comparator circuit 7.3 of A/D converter 42, switches S41 and S42 are rendered conductive, whereby capacitors 51 and 54 are charged to a level between output offset voltages VS2__1 and VS2B__1 of amplifier 33 of SH.SBT14 of A/D converter block 1 and bias voltage Vb and capacitors 52 and 53 are charged to a level between comparison reference voltages V14 and V3 generated by reference voltage generation circuit 41 and bias potential Vb. The same applies for other voltage comparators 7.5, 7.7, ..., 7.13.

Here, reference voltages for comparison of a certain voltage comparator 7 are represented as VR and VRB, and the voltages generated at the first phase are represented as VR__1 and VRB__1. Also, the amount of charge QX__1 and QXB__1 of the first phase of input nodes 55a and 55b, respectively, of amplifier 55 becomes:

$$QX\_1 = (Vb - VS2\_1) \times C + (Vb - VR\_1) \times C$$
$$= C(2Vb - VS2\_1 - VR\_1)$$
$$QXB\_1 = (Vb - VS2B\_1) \times C + (Vb - VRB\_1) \times C$$
$$= C(2Vb - VS2B\_1 - VRB\_1)$$

According to ΔQX__1=QX__1−QXB__1, ΔVS2__1=VS2__1−VS2B__1, and ΔVR2__1=VR__1−VRB__1, ΔQX__1=−C(ΔVS2__1+ΔVR__1) is obtained.

In SH.SBT44, switches S66 and S66' are rendered non-conductive, and signal voltages VS2__1 and VS2B__1 are connected to capacitors 8.1 and 8.1' of SH.SBT44. In D/A converter 43, one of switches S52, S54, ..., S64 (for example switch S54) and a corresponding one of switches S52', S54', ..., S64' (switch S62') are rendered conductive. The remaining switches attain a non-conductive state. Therefore, among capacitors 8.1, 8.2, 8.4, ..., 8.14; 8.1', 8.2', 8.4', ..., 8.14' of SH.SBT44, the respective one electrodes of capacitors other than capacitors 8.1 and 8.1' connected to VS2 and VS2B, and capacitors 8.4 and 8.12' connected to switches S54 and S62' which attain a conductive state in D/A converter 43 all attain a high impedance state. Capacitors with one electrode of a high impedance state do not operate. SH.SBT44 is in a subtraction·holding state in the first phase, and the output is ΔVS2__2−ΔVS2__1−ΔVDA. Here, ΔVDA is the output of D/A converter 43. The description thereof will be provided afterwards.

In SH.R45 of FIG. 17, switches S72, S74, ..., S86; S72', S74', ..., S86' attain a conducting state. Capacitors 9.1 and 9.1' are charged by Vb and V10__1, and Vb and V6__1, respectively. The remaining capacitors are charged by Vb and V8. Here, assuming that the amount of charge of input nodes 57a and 57b of amplifier 57 are QY__1 and QYB__1, respectively, and ΔQY__1 is the difference thereof, the following equations are established.

$$QY\_1=(Vb-V10\_1)\times C+7\times(V8-Vb)$$
$$QYB\_1=(Vb-V6\_1)\times C+7\times(V8-Vb)$$
$$\Delta QY\_1=-(V10\_1-V6\_1)\times C$$

(Second Phase of A/D Converter Block 2 of Second Stage)

When switched to the second phase, ΔVS2 becomes the subtraction voltage, and ΔVR2 becomes the output offset voltage of amplifier 36 of SH.R15 of A/D converter block 1. A/D converter 42 carries out a comparison operation. SH.SBT44 attains a sampling period and SH.R45 attains a holding period.

In voltage comparator 7 of A/D converter 43, ΔVS2__1 and ΔVR__1 are sampled at the first phase. Assuming that the potentials of nodes 55a and 55b in the second phase are VX__2 and VXB__2, and the charged amount of nodes 55a and 55b of the second phase are QX__2 and QXB__2, respectively, the following is established.

$$QX\_2 = C(VX\_2 - VS2\_2) + C(VX\_2 - VR\_2)$$
$$= C(2VX\_2 - VS2\_2 - VR\_2)$$
$$QXB\_2 = C(VXB\_2 - VSB2\_2) + C(VXB\_2 - VRB\_2)$$
$$= C(2VXB\_2 - VSB2\_2 - VRB\_2)$$
$$\Delta QX\_2 = C(2\Delta VX\_2 - (\Delta VS2\_2 - \Delta VR\_2))$$

Since QX and QXB do not change during the first and second phases, the following equations are established.

$$\Delta QX\_1 = \Delta QX\_2 - C(\Delta VS2\_1 + \Delta VR\_1)$$
$$= C(\Delta VX\_2 - (\Delta VS2\_2 + \Delta VR\_2))$$
$$\Delta VX\_2 = ((\Delta VS2\_2 - \Delta VS2\_1) + (\Delta VR\_2 - \Delta VR\_1))/2.$$

ΔVS2__2 is the output when SH.SBT14 of A/D converter block 1 is in a holding state. This output is the amplification of the result of subtracting the output voltage of D/A converter 13 from the input analog voltage. It is to be noted that the output offset voltage of amplifier 33 of SH.SBT14 is included in ΔVS-2. ΔVS__1 is the output when SH.SBT14 attains a sampling state, and Vb is applied to input nodes 33a and 33b of amplifier 33 of SH.SBT14. Therefore, ΔVS2__1 becomes the output offset voltage of amplifier 33 of SH.SBT14. Thus, ΔVS2__2−ΔVS2__1 is a signal having the influence of the output offset voltage of amplifier 33 of SH.SBT14 corrected.

ΔVR__1 is the output when SH.R15 of A/D converter block 1 attains a holding state. This output is an amplification of the voltage corresponding to 1 LSB of A/D converter block 1. It is to be noted that the output offset voltage of amplifier 36 of SH.R15 is added in $\Delta VR\_1$. $\Delta VR\_2$ is the output when SH.R15 attains a sampling state, and Vb is applied to input nodes 36a and 36a of amplifier 36 of SH.R15. Therefore, $\Delta VR\_2$ becomes the output offset voltage of amplifier 36 of SH.R15. Therefore, $-(\Delta VR\_2-\Delta VR\_1)$ becomes the reference voltage for comparison having the influence of the output offset voltage of amplifier 36 of SH.R15 corrected. Therefore, $\Delta VX\_2$ becomes the difference between $\Delta VS2$ and $\Delta VR$ having the influence of the output offset voltages of amplifiers 33 and 36 of SH.SBT14 and SH.R15 of A/D converter block 1 removed. Thus, comparison of a higher accuracy can be provided.

The output of voltage comparator circuit 7 is ascertained at the second phase and applied to encoder 46. SH.R45 of FIG. 17 attains a holding state, and switches S86 and S86' are rendered conductive. Switches S72, S74, . . . , S84; S72', S74', . . . , S84' are rendered non-conductive. Assuming that the potentials of nodes 57a and 57b are VY and VYB, respectively, and the difference thereof is $\Delta VYB$, the following is established.

$$QY\_2=C(VY-V10\_2)+C(VY-Vb)$$

$$QYB\_2=C(VYB-V6\_2)+C(VYB-Vb)$$

$$\Delta QY\_2=C(2\Delta VY\_2-V10\_2+V6\_2)$$

Since $\Delta QY\_1=\Delta QY\_2$, the following is obtained.

$$-(V10\_1-V6\_1)\times C=C(2\Delta VY\_2-V10\_2+V6\_2)$$

$$\Delta VY\_2=((V10\_2-V10\_1)-(V6\_2-V6\_1))/2$$

Since $V10\_2-V6\_2$ is the output offset voltage of amplifier 36 of SH.R15 of A/D converter block 1, and $V10\_1-V6\_1$ is the reference voltage including the output offset voltage of amplifier 36 of SH.R15, $\Delta VY\_2$ becomes a voltage having the influence of the output offset voltage of amplifier 36 of SH.R removed. Therefore, a reference voltage of a higher accuracy can be transmitted to A/D converter block 3 of the next stage.

SH.SBT44 of FIG. 15 attains a sampling state in the second phase, and switches S66 and S66' are rendered conductive. Also, all switches S52, S54, . . . , S46; S52', S54', . . . , S64' of D/A converter 43 are rendered conductive. Therefore, all the capacitors 8.1, 8.2, 8.4, . . . , 8.14; 8.1', 8.2', 8.4', . . . , 8.14' of SH.SBT44 are charged.

In D/A converter 43, only the switches selected at the first phase (for example switches S54 and S62') are rendered conductive, and all the remaining switches are rendered non-conductive. The capacitor connected to non-conducting switches will not be charged since one electrode of the capacitor attains a high impedance state. Furthermore, the influence of the output offset voltage of the selected reference voltage (in this case V4 and V12) is removed since they are sampled by SH.SBT44 at the second phase. Therefore, similar to SH.R45, a subtracted result having the influence of the offsets of $\Delta VS2$ and $\Delta VR2$ removed is held in the first phase in SH.SBT44.

(A/D Converter Block 3 of the Third Stage)

In the first phase of A/D converter block 2, SH.SBT44 is in a subtraction·holding period, and SH.R45 is in a sampling period. In the second phase of A/D converter block 2, SH.SBT44 is in a sampling period and R45 is in a holding period. In A/D converter block 3, an operation having the operations of the first phase and the second phase replaced of A/D converter block 2 is carried out. More specifically, in the first phase of A/D converter block 3, SH.SBT64 is in a sampling period and SH.R is in a holding period. In the second phase of A/D converter block 3, SH.SBT64 is in a subtracting. holding period, and SH.R65 is in a sampling period. Therefore, an A/D conversion of 3 bits is carried on the signal having the influence of the output offset voltages of amplifiers 56 and 57 of SH.SBT44 and SH.R45 of A/D converter block 2 removed, and a sample/substraction·holding operation can be carried out.

(A/D Converter Block 4 of the Last Stage)

Since A/D converter block 4 is the final stage, a D/A converter, a SH.SBT, and a SH.R are not required. However, A/D converter 72 of A/D converter block 4 differs from A/D converters 42 and 62 of the second and third stages, respectively, in that eight reference voltages for comparison Vr1", Vr3", . . . , Vr15" are required. The output codes of A/D converter 72 is $-1$~7.

(Logic Circuit)

Logic circuit 5 generates and provides a digital code D0 of 10 bits having digital code D2 of 4 bits of A/D converter block 1 of the first stage assigned to the tenth~seventh bit, digital code DC of 3 bits of A/D convert block 2 of the second stage assigned to the seventh bit~fifth bit, digital code D4 of 3 bits of A/D converter block 3 of the third stage to fifth bit~third bit, and digital code D5 of 3 bits of A/D converter block 4 of the last stage to the third bit~first bit. The eventual digital codes of A/D converter blocks 1~4 overlapped each other by one bit. Even if A/D converters 12, 42 and 62 in A/D converter blocks 1~3 include an error, it will be corrected by one of A/D converter blocks 2~4 of a succeeding stage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A pipeline type A/D converter operating in synchronization with a clock signal for converting an externally applied analog voltage into a digital code of a predetermined number of bits, comprising:

a first A/D converter to sample said analog voltage at a period when said clock signal attains a first potential for converting said sampled analog voltage into a first digital code at a period when said clock signal attains a second potential, a D/A converter for converting said first digital code generated by said first A/D converter into an analog voltage, and providing that analog voltage at a period when said clock signal attains the second potential, first sample/hold means for sampling said externally applied analog voltage and outputting an offset voltage at a period when said clock signal attains the first potential, and for subtracting an analog voltage generated by said D/A converter from said sampled analog voltage to provide a subtracted result at a period when said block signal attains a second potential, first subtracter means for subtracting an output voltage of said first sample/hold means of a period where said clock signal attains the first potential from an output voltage of said first sample/hold means of a period where said clock signal attains the second potential, a second A/D converter for converting a subtracted result of said first subtracter means into a second digital code, and a logic circuit for generating said digital code of a predetermined number of bits according to first and second digital codes generated by said first and second A/D converters.

2. The pipeline type A/D converter according to claim 1, wherein said first A/D converter includes first voltage generation means for generating a plurality of first reference voltages for comparison corresponding to a plurality of digital codes, respectively, and a plurality of reference voltages for subtraction corresponding to said plurality of digital codes, respectively, a plurality of first voltage comparator means provided corresponding to said plurality of first reference voltages for comparison, respectively, each sampling said analog voltage at a period when said clock signal attains the first potential for comparing said sampled analog voltage with a corresponding first reference voltage for comparison at a period when said clock signal attains the second potential, and a first encoder selecting any of said plurality of digital codes according to a comparison result of said plurality of first voltage comparator means for providing said selected digital code as said first digital code, wherein said D/A converter includes first switch means provided corresponding to each reference voltage for subtraction generated by said first voltage generation means, having one terminal receiving a corresponding reference voltage for comparison, and another terminal connected to said first sample/hold means, and rendered conductive in response to selection of a corresponding digital code by said first encoder, wherein said second A/D converter includes second voltage generation means for generating a plurality of second reference voltages for comparison corresponding to a plurality of digital codes, respectively, a plurality of second voltage comparator means provided corresponding to said plurality of second reference voltages for comparison, respectively, each comparing a corresponding second reference voltage for comparison and a subtracted result of said first subtracter means, and a second encoder selecting any of said plurality of digital codes according to a comparison result of said plurality of second voltage comparator means for providing said selected digital code as said second digital code.

3. The pipeline type A/D converter according to claim 2, wherein each first voltage comparator means includes first and second output nodes from which signals complementary to each other according to said comparison result are output, first and second constant current sources for supplying a predetermined current to said first and second output nodes, respectively, a first transistor of a first conductivity type having a first electrode connected to said first output node, and to which said analog voltage is applied, a second transistor of the first conductivity type having a first electrode connected to said second output node, and to which a corresponding first reference voltage for comparison is applied, a third transistor of a second conductivity type having a first electrode connected to said first output node, and an input electrode connected to said second output node, a fourth transistor of the second conductivity type having a first electrode connected to said second output node, and an input electrode connected to said first output node, and switching means for connecting second electrodes of said first and second transistors to a line of a reference potential when said clock signal attains the first potential, and connects second electrodes of said third and fourth transistors to said line of a reference potential when said clock signal attains the second potential.

4. The pipeline type A/D converter according to claim 2, wherein said first voltage generation means further generates a reference voltage corresponding to 1 LSB of said first A/D converter, said pipeline type A/D converter further comprising second sample/hold means for sampling said reference voltage and outputting an offset voltage at a period when said clock signal attains the second potential, and for providing said sampled reference voltage at a period when said clock signal attains the first potential, wherein said second voltage generation means divides an output voltage of said second sample/hold means for generating said plurality of second reference voltages for comparison, wherein said second A/D converter further includes second subtracter means provided corresponding to each second reference voltage for comparison generated by said second voltage generation means for subtracting a value of a corresponding second reference voltage for comparison of a period when said clock signal attains the second potential from a value of a corresponding second reference voltage of a period when said clock signal attains the first potential to output a subtracted result, wherein said second voltage comparator means compares an output voltage of said first subtracter means with an output voltage of a corresponding second subtracter means.

5. A pipeline type A/D converter operating in synchronization with a clock signal for converting an externally applied analog potential into a digital code of a predetermined number of bits, comprising:

a first A/D converter for sampling said analog potential at a period when said clock signal attains a first potential, and converting said sampled analog potential into a first digital code at a period when said clock signal attains a second potential, a D/A converter for converting the first digital code generated by said first A/D converter into an analog potential, and providing said analog potential and a first reference potential at a period when said clock signal attains the second potential, first switching means having one terminal receiving said externally applied analog potential for conducting at a period when said clock signal attains the first potential to sample said analog potential, second switching means having one terminal receiving said first reference potential for conducting at a period when said clock signal attains the first potential to cancel noise generated by said first switching means, a first capacitor having one electrode connected to another terminal of said first switching means and receiving an analog potential generated by said D/A converter for subtracting an analog potential generated by said D/A converter from an analog potential sampled by said first switching means, a second capacitor having one electrode connected to another terminal of said second switching means and receiving said first reference potential output from said D/A converter, third switching means having one terminal receiving a second reference potential, and another terminal connected to other electrodes of said first and second capacitors for conducting at a period when said clock signal attains the first potential to charge said first and second capacitors, respectively, a first differential amplifier having first and second input nodes connected to other electrodes of said first and second capacitors, first subtracter means for subtracting an output voltage of said first differential amplifier of a period when said clock signal attains the second potential from an output voltage of said first differential amplifier of a period when said clock signal attains the second potential, a second A/D converter for converting a subtracted result of said first subtracter means into a second digital code, and a logic circuit for generating said digital code of a predetermined number of bits according to first and second digital codes generated by said first and second A/D converters.

6. The pipeline type A/D converter according to claim 5, wherein said first A/D converter includes reference potential generation means for generating a plurality of reference potentials for comparison corresponding to a plurality of digital codes, respectively, and a plurality of reference potentials for subtraction corresponding to said plurality of digital codes, respectively, a plurality of potential comparator means provided corresponding to said plurality of reference potentials for comparison, respectively, each sampling said externally applied analog potential at a period when said clock signal attains the first potential for comparing said sampled analog potential with a corresponding reference potential for comparison at a period when said clock signal attains the second potential, and a first encoder for selecting any of said plurality of digital codes according to a comparison result of said plurality of potential comparator means to output said selected digital code as said first digital code, wherein said D/A converter includes fourth switching means provided corresponding to each reference potential for subtraction generated by said reference potential generation means, having one terminal receiving a corresponding reference potential for comparison and another terminal connected to one electrode of said first capacitor for conducting in response to a corresponding digital code being selected by said first encoder, and fifth switching means provided corresponding to said fourth switching means, having one terminal receiving said first reference potential, and another terminal connected to one electrode of said second capacitor for conducting simultaneous to said fourth switching means to cancel noise generated by said fourth switching means, wherein said second A/D converter includes reference voltage generation means for generating a plurality of reference voltages for comparison corresponding to a plurality of digital codes, respectively, a plurality of voltage comparator means provided corresponding to said plurality of reference voltages for comparison, respectively, each comparing a corresponding reference voltage for comparison with a subtracted result of said first subtracter means, and a second encoder for selecting any of said plurality of digital codes according to a comparison result of said plurality of voltage comparator means to output said selected digital code as said second digital code.

7. The pipeline type A/D converter according to claim 6, wherein each potential comparator means includes first and second output nodes from which signals complementary to each other are output according to said comparison result, first and second current sources for supplying a predetermined current to said first and second output nodes, respectively, a first transistor of a first conductivity type having a first electrode connected to said first output node, and having an input electrode to which said externally applied analog potential is provided, a second transistor of the first conductivity type having a first electrode connected to said second output node, and having an input electrode to which a corresponding reference potential for comparison is provided, a third transistor of a second conductivity type having a first electrode connected to said first output node, and an input electrode connected to said second output node, a fourth transistor of the second conductivity type having a first electrode connected to said second output node, and an input electrode connected to said first output node, and switching means for connecting second electrodes of said first and second transistors to a line of a third reference potential at a period when said clock signal attains the first potential, and for connecting second electrodes of said third and fourth transistors to said line of a third reference potential at a period when said clock signal attains the second potential.

8. The pipeline type A/D converter according to claim 6, further comprising:

sixth switching means having one terminal receiving a certain reference potential for comparison generated by said reference potential generation means for conducting at a period when said clock signal attains the second potential to sample said certain reference potential for comparison, seventh switching means having one electrode receiving a reference potential for comparison lower than said certain reference potential for comparison by a voltage corresponding to 1 LSB for conducting at a period when said clock signal attains the second potential to sample that reference potential for comparison, third and fourth capacitors, each having one electrode connected to each another terminal of said sixth and seventh switching means, respectively, eighth switching means having one terminal receiving said second reference potential, and another terminal connected to another electrodes of said third and fourth capacitors for conducting at a period when said clock signal attains the second potential to charge said third and fourth capacitors, ninth switching means having one terminal receiving said first reference potential, and another terminal connected to one electrodes of said third and fourth capacitors for conducting at a period when said clock signal attains the first potential, and a second differential amplifier having first and second input nodes connected to other electrodes of said third and fourth capacitors, wherein said reference voltage generation means divides an output voltage of said second differential amplifier for generating said plurality of reference voltages for comparison, wherein said second A/D converter further includes second subtracter means provided corresponding to each reference voltage for comparison generated by said reference voltage generation means for subtracting a value of a corresponding reference voltage for comparison of a period when said clock signal attains the second potential from a value of a corresponding reference voltage for comparison of a period when said clock signal attains the first potential to output a subtracted result, wherein said voltage comparator means compares an output voltage of said first subtracter means with an output voltage of a corresponding second subtracter means.

9. The pipeline type A/D converter according to claim 8, wherein said first subtracter means includes fifth and sixth capacitors receiving an output voltage of said first differential amplifier between each one electrode, and tenth switching means having one electrode receiving said second reference potential, and another terminal connected to another terminals of said fifth and sixth capacitors for conducting at a period when said clock signal attains the first potential to charge said fifth and sixth capacitors, wherein said second subtracter means includes seventh and eighth capacitors receiving a corresponding reference voltage for comparison between respective one electrodes, and having respective other electrodes connected to other electrodes of said sixth and fifth capacitors, wherein said second voltage comparator means compares potentials of another electrodes of said fifth and sixth capacitors at a period when said clock signal attains the second potential.

10. A voltage comparator sampling an external voltage at a sampling period and comparing said sampled external voltage with a predetermined reference voltage at a comparison period to output a comparison result, comprising:

first and second output terminals from which signals complementary to each other are output according to said comparison result, first and second constant current sources for supplying a predetermined current to said first and second output terminals, respectively, a first transistor of a first conductivity type having one electrode connected to said first output terminal, and to which said external voltage is applied, a second transistor of the first conductivity type having a first electrode connected to said second output terminal, and to which said reference voltage is applied, a third transistor of a second conductivity type having a first electrode connected to said first output terminal, and an input electrode connected to said second output terminal, a fourth transistor of the second conductivity type having a first electrode connected to said second output terminal, and an input electrode connected to said first output terminal, and switching means for connecting second electrodes of said first and second transistors to a line of a reference potential at said sampling period, and for connecting second electrodes of said third and fourth transistors to said line of a reference potential at said comparison period.

* * * * *